US009467147B2

(12) United States Patent
Choi et al.

(10) Patent No.: US 9,467,147 B2
(45) Date of Patent: Oct. 11, 2016

(54) COUNTER CIRCUIT AND IMAGE SENSOR INCLUDING THE SAME

(71) Applicant: Samsung Electronics Co., Ltd., Suwon-si (KR)

(72) Inventors: Won-Ho Choi, Suwon-si (KR); Jin-Woo Kim, Seoul (KR); Hyeok-Jong Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 14/531,285

(22) Filed: Nov. 3, 2014

(65) Prior Publication Data

US 2015/0124926 A1 May 7, 2015

(30) Foreign Application Priority Data

Nov. 4, 2013 (KR) ........................ 10-2013-0132793

(51) Int. Cl.
*H03K 25/00* (2006.01)
*H03K 21/10* (2006.01)
*H03K 21/02* (2006.01)

(52) U.S. Cl.
CPC ............ *H03K 21/10* (2013.01); *H03K 21/023* (2013.01)

(58) Field of Classification Search
CPC ...... H03K 23/78; H03K 23/86; H03K 21/10; H03M 1/34
USPC ......... 377/94, 37, 44, 107, 115, 27, 98, 118, 377/127; 345/690
See application file for complete search history.

(56) References Cited

U.S. PATENT DOCUMENTS

| | | | |
|---|---|---|---|
| 7,777,170 B2 | 8/2010 | Murakami et al. | |
| 7,864,915 B2* | 1/2011 | Zhang | H03K 21/12 377/119 |
| 7,911,519 B2 | 3/2011 | Saito et al. | |
| 8,035,717 B2 | 10/2011 | Hisamatsu | |
| 8,169,517 B2 | 5/2012 | Poonnen et al. | |
| 8,174,594 B2 | 5/2012 | Koh | |
| 8,330,635 B2 | 12/2012 | Hisamatsu | |
| 8,334,492 B2 | 12/2012 | Shikanai | |
| 9,042,508 B2* | 5/2015 | Hisamatsu | H03K 21/023 377/116 |
| 2011/0221499 A1* | 9/2011 | Takeda | H03K 23/44 327/286 |
| 2012/0008028 A1 | 1/2012 | Egawa | |
| 2012/0033097 A1 | 2/2012 | Lim et al. | |
| 2012/0306674 A1 | 12/2012 | Wang et al. | |

FOREIGN PATENT DOCUMENTS

JP 2012-095218 5/2012

* cited by examiner

*Primary Examiner* — Lincoln Donovan
*Assistant Examiner* — Thomas Skibinski
(74) *Attorney, Agent, or Firm* — Myers Bigel & Sibley, P.A.

(57) ABSTRACT

An integrated circuit counter includes a cascaded chain of bit counters, which are collectively configured to count a number of first edges of a counter input signal received at an input thereof and output the count as a counter output signal. The cascaded chain includes at least two bit counters, which are: (i) configured to support both counter and buffer modes of operation, and (ii) responsive to respective bypass control bit signals having values that specify whether a corresponding one of the at least two bit counters is disposed in the counter or buffer mode of operation.

18 Claims, 21 Drawing Sheets

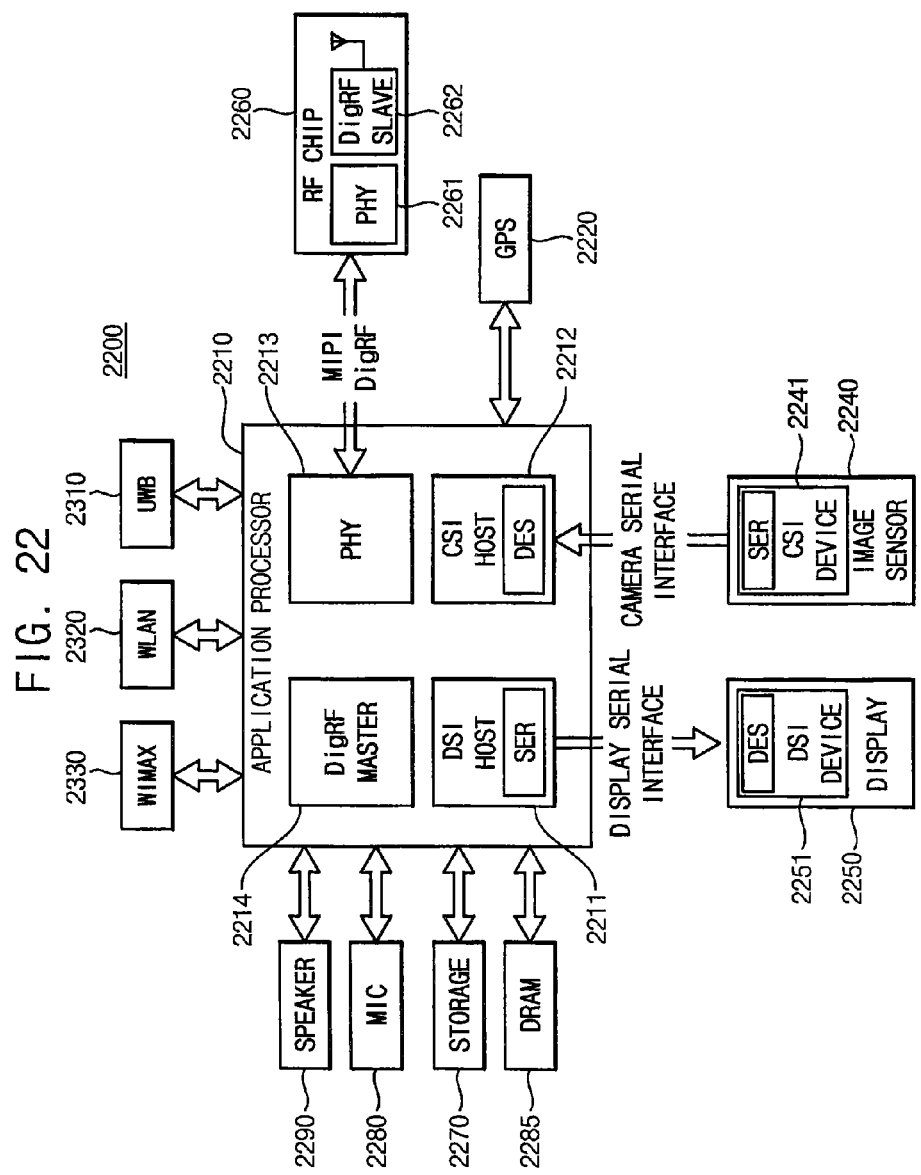

COUNTER CIRCUIT AND IMAGE SENSOR INCLUDING THE SAME

REFERENCE TO PRIORITY APPLICATION

This U.S. Non-provisional application claims priority under 35 USC §119 to Korean Patent Application No. 10-2013-0132793, filed on Nov. 4, 2013, in the Korean Intellectual Property Office (KIPO), the disclosure of which is hereby incorporated herein by reference in its entirety.

BACKGROUND

1. Technical Field

Example embodiments relate generally to semiconductor device, and more particularly to a counter circuit that can selectively bypass a received signal as an output signal and an image sensor including the counter circuit.

2. Discussion of the Related Art

A high-definition image sensor can require a high-definition analog-digital converter to covert an analog signal to a high-definition digital signal. A typical image sensor uses a single-slope analog-digital converter (SS-ADC) as an analog-digital converter. The SS-ADC converts a value of an analog output signal of the pixel to the digital output signal by operating counter circuits when the value of the analog output signal of the pixel is equal to or larger than a value of a ramp signal. A high definition SS-ADC requires a high-speed counter circuit including bit counters and bit memories. When the bit counters and the bit memories are separated to prevent damage to memory caused by increased current by the high-speed counter circuit and fluctuation of driving voltage, signal lines are required to transfer digital signals generated by bit counters to the separated bit memories. The signal lines for several thousand columns of a pixel array of the image sensor typically increase a size and a manufacturing cost of the image sensor.

SUMMARY

At least one example embodiment of the inventive concept provides a counter circuit that can transfer a count value without an additional signal line. At least one example embodiment of the inventive concept provides an image sensor including a counter circuit that can transfer a count value without an additional signal line.

According to example embodiments, a counter circuit includes a plurality of cascade-connected bit counters. The bit counters are configured to output a count value of edges of a counter input signal as a counter output signal. Each of the bit counters operates selectively in a counter mode or a buffer mode in response to each of bypass control bit signals. Each of the bit counters performs a counting operation in response to a received signal in the counter mode. Each of the bit counters bypasses the received signal as an output signal in the buffer mode after finishing the counter mode.

In an example embodiment, the bypass control bit signals may be enabled sequentially from a first bypass control bit signal corresponding to a most significant bit (MSB) of the bypass control bit signals to a second bypass control bit signal corresponding to a least significant bit (LSB) of the bypass control bit signals.

In another example embodiment, the bit counters may enter the buffer mode sequentially from a most significant bit counter included in the bit counters to a least significant bit counter included in the bit counters in response to the bypass control bit signals.

In an example embodiment, the counter output signal may include bit values of the count value. The bit values may be outputted sequentially as the output signal of the most significant bit counter.

In an example embodiment, the output signal of a most significant bit counter included in one or more counter mode bit counters may be outputted as the counter output signal by bypassing one or more buffer mode bit counters. The bit counters may include the one or more counter mode bit counters and the one or more buffer mode bit counters. The one or more counter mode bit counters may be first bit counters operating in the counter mode. The one or more buffer mode bit counters may be second bit counters operating in the buffer mode.

In an example embodiment, the counter circuit may further comprise bit memories configured to store the bit values of the count value included in the counter output signal sequentially in response to memory control bit signals.

In an example embodiment, a first memory control bit signal corresponding to a bit of a most significant bit counter included in the one or more counter mode bit counters may be only enabled when the output signal of the most significant bit counter included in the one or more counter mode bit counters is outputted as the counter output signal.

In an example embodiment, each of the bit counters may include a flip-flop and a feedback signal line. The feedback signal line may be configured to connect one of the input ports of the flip-flop and one of the output ports of the flip-flop for a toggling operation. The each of the bit counters may bypass the received signal as the output signal through the feedback signal line.

In an example embodiment, each of the bit counters may include an enable controller, a first inverting unit, a data flip-flop, and a feedback signal line. The enable controller may be configured to generate an inverted enable signal by performing a logical OR operation on a reset signal and a bypass control bit signal corresponding to each of the bit counters. The first inverting unit may be configured to generate an inverted signal of the received signal selectively based on the bypass control bit signal. The data flip-flop may include a clock signal port receiving the received signal, an inverted enable signal port receiving the inverted enable signal, a data signal port electrically connected to an output port of the first inverting unit, and an output port outputting a stored value in the data flip-flop. The feedback signal line may be configured to electrically connect an inverted output signal port of the data flip-flop and the data signal port.

In an example embodiment, the data flip-flop may include a second inverting unit configured to invert a signal transferred through the feedback signal line and output the inverted signal through the output signal port in the buffer mode.

In an example embodiment, in the counter mode, the data flip-flop may receive an inverted signal of the stored value through the data signal port and toggle the stored value.

In an example embodiment, in the buffer mode, each of the bit counters may bypass the received signal as the output signal through the first inverting unit, the feedback signal line and the second inverting unit.

In an example embodiment, each of the bit counters may include an enable controller, a toggle unit, a bypass signal line, and a multiplexer. The enable controller may be configured to generate an inverted enable signal by performing a logical OR operation on a reset signal and a bypass control bit signal corresponding to each of the bit counters. The toggle unit may be configured to invert a stored value at an edge of the received signal when the inverted enable signal has logic value 0, and output the inverted stored value as a toggle output signal. The bypass signal line may be configured to transfer the received signal by bypassing the toggle unit. The multiplexer may be configured to output either the toggle output signal or the received signal transferred through the bypass signal line in response to the bypass control bit signal.

In an example embodiment, the toggle unit may include a data flip-flop. The data flip-flop may include a data signal port electrically connected to an inverted output signal port, a clock signal port receiving the received signal, an inverted enable signal port receiving the inverted enable signal, and an output signal port outputting the toggle output signal.

In an example embodiment, the toggle unit may include a T flip-flop. The T flip-flop may include a toggle port electrically connected to driving voltage (VDD), a lock signal port receiving the received signal, an inverted enable signal port receiving the inverted enable signal, and an output signal port outputting the toggle output signal.

In an example embodiment, the toggle unit may include a JK flip-flop. The JK flip-flop may include a J port electrically connected to VDD and a K port electrically connected to VDD, a clock signal port receiving the received signal, an inverted enable signal port receiving the inverted enable signal, and an output signal port outputting the toggle output signal.

According to example embodiments, an image sensor comprises a pixel array, one or more comparators, one or more counter circuits, and a switch circuit. The pixel array includes one or more pixels configured to generate pixel signals corresponding to an intensity of incident light. The one or more comparators generate compared result signals by comparing the pixel signals and a ramp signal. Each of the one or more counter circuits includes a plurality of cascade-connected bit counters to output a count value of edges of a clock signal as a counter output signal based on each of the compared result signals. The switch circuit outputs one of the counter output signals of the one or more counter circuits as a final result signal through a common output line based on a column selection signal. Each of the bit counters operates selectively in a counter mode or a buffer mode in response to each of bypass control bit signals. Each of the bit counters performs a counting operation in response to a received signal in the counter mode. Each of the bit counters bypasses the received signal as an output signal in the buffer mode after finishing the counter mode.

According to example embodiments, a counter circuit comprises a global counter unit and at least one latch unit. The global counter unit is configured to output bit values of a count value of edges of a global counter input signal. The at least one latch unit includes the plurality of latch units and outputs latched bit values of the count values as a latch output signal sequentially. Each of the at least one latch unit operates in either a latch mode or a buffer mode. The each of the at least one latch unit latches each of bit values of the count value respectively in response to each of latch control bit signals in the latch mode. The each of the bit counters bypasses a received signal as an output signal respectively in response to the each of the latch control bit signals after finishing the latch mode.

As described above, the counter circuit which transfers a count value from the bit counters to the bit memories by using a bit counter bypassing the received signal as the output signal through the feedback signal line of the flip-flop according to the example embodiments may be implemented in a smaller die because the counter circuit does not require additional signal lines to transfer data from the bit counters to the bit memories.

The counter circuit which transfers the count value from the bit counters to the bit memories by using a bit counter bypassing the received signal as the output signal through the bypass signal line according to the example embodiments may be implemented in smaller die because the bypass signal line can be implemented at an area which is already used and does not include logic gate in layout.

In the counter circuit separating the latch block latching the bit values of the count value of the global counter and the memory block storing the latched bit values, because a first operation converting analog signal to digital signal and a second operation reading data occur in different place, bad effect between the first operation and the second operation decrease.

BRIEF DESCRIPTION OF THE DRAWINGS

Example embodiments of the inventive concept will be more clearly understood from the following detailed description taken in conjunction with the accompanying drawings.

FIG. 22 is a block diagram illustrating an example of an interface used in the computing system of FIG. 21.

DETAILED DESCRIPTION OF THE EMBODIMENTS

Figure 1:
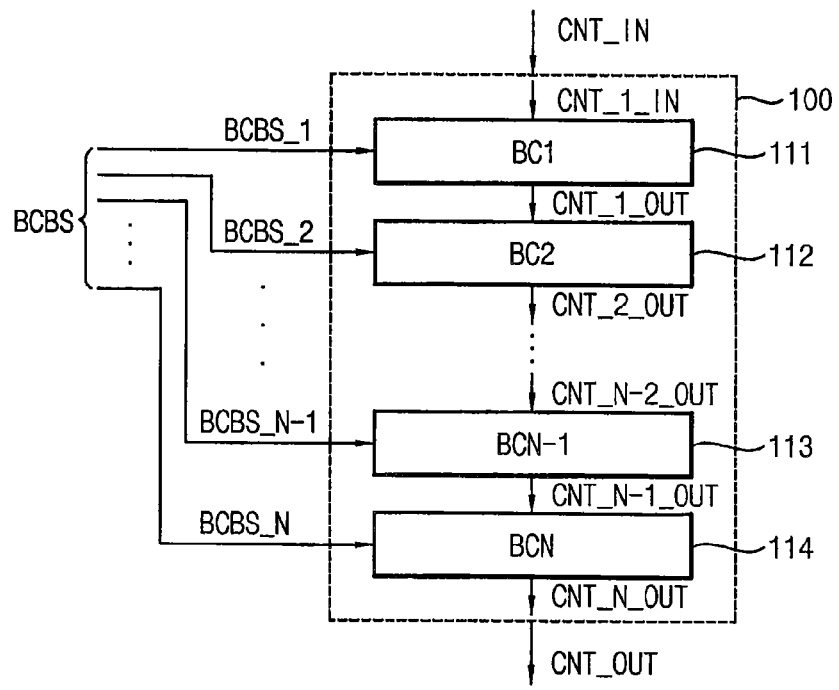
FIG. 1 is a block diagram illustrating a counter circuit according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a counter circuit according to example embodiments. Referring to FIG. 1, a counter circuit 100 includes a plurality of bit counters (BC1, BC2, BCN−1, and BCN) 111, 112, 113 and 114. The counter circuit 100 receives a counter input signal CNT_IN, and generates a counter output signal CNT_OUT in response to bypass control bit signals BCBS_1, BCBS_2, BCBS_N−1 and BCBS_N.

A plurality of bit counters 111, 112, 113 and 114 are cascade-connected to each other. In detail, in the cascade-connection, a former bit counter's output signal is transferred to a latter bit counter's input signal, and bit counters 111, 112, 113 and 114 form a chain structure. The counter input signal CNT_IN may be a first bit counter input signal CNT_1_IN. A (N)th bit counter output signal CNT_N_OUT may be the counter output signal CNT_OUT.

A first bit counter 111 generates a first bit counter output signal CNT_1_OUT based on the first bit counter input signal CNT_1_IN and a first bypass control bit signal BCBS_1. A second bit counter 112 generates a second bit counter output signal CNT_2_OUT based on the first bit counter output signal CNT_1_OUT and a second bypass control bit signal BCBS_2. A (N−1)th bit counter 113 generates a (N−1)th bit counter output signal CNT_N−1_OUT based on a (N−2)th bit counter output signal CNT_N−2_OUT and a (N−1)th bypass control bit signal BCBS_N−1. A (N)th bit counter 114 generates the (N)th bit counter output signal CNT_N_OUT based on the (N−1)th bit counter output signal CNT_N−1_OUT and a (N)th bypass control bit signal BCBS_N.

The counter circuit 100 outputs the counter output signal CNT_OUT sequentially including a count value of edges of the counter input signal CNT_IN. A conventional counter circuit transfers outputs of each of bit counters 111, 112, 113 and 114 to each of bit memories separated from the bit counters 111, 112, 113 and 114 through additional signal lines or bus. The counter circuit 100 according to an example embodiment doesn't require such additional signal lines or bus used in the conventional counter circuit.

The bit counters 111, 112, 113 and 114 count each of bit values of the count value. The first bit counter 111 may count bit value of a least significant bit (LSB) of the count value of the counter circuit 100. The second bit counter 112 may count bit value of a bit which is one bit higher than the LSB of the counter value of the counter circuit 100. The (N−1)th bit counter 113 may count bit value of a bit which is one bit lower than a most significant bit (MSB) of the count value of the counter circuit 100. The (N)th bit counter 114 may count bit value of the MSB of the count value of the counter circuit 100.

Each of the bypass control bit signals BCBS may represent operation of each of the bit counters 111, 112, 113 and 114. Each of the bypass control bit signals BCBS may have the logical value 0 in a counter mode. Each of the bypass control bit signals BCBS may have the logical value 1 in a buffer mode.

The (N)th bit counter 114 outputs bit value corresponding to the MSB of the count value as the (N)th bit counter output signal CNT_N_OUT in a counter mode when the (N)th bypass control bit signal BCBS_N has the logical value 0.

The (N)th bit counter 114 bypasses the (N−1)th bit counter output signal CNT_N−1_OUT as the (N)th bit counter output signal CNT_N_OUT in a buffer mode when (N)th bypass control bit signal BCBS_N has the logical value 1.

Operation of the first bit counter 111, the second bit counter 112 and the (N−1)th bit counter 113 in the counter mode and the buffer mode may be understood based on the operation of the (N)th bit counter 114 in the counter mode and the buffer mode.

Bypassing operation of each of the bit counters 111, 112, 113 and 114 will be described with the reference to FIGS. 6 through 11.

For example, bypass control bit signals BCBS_1, BCBS_2, BCBS_N−1, BCBS_N may be enabled sequentially from the first bypass control bit signal BCBS_1 to the (N)th bypass control bit signal BCBS_N. The output signal of a most significant bit counter included in one or more counter mode bit counters may be outputted as the counter output signal CNT_OUT by bypassing one or more buffer mode bit counters. The one or more counter mode bit counters may be first bit counters operating in the counter mode. The one or more buffer mode bit counters may be second bit counters operating in the buffer mode.

Figure 2A:
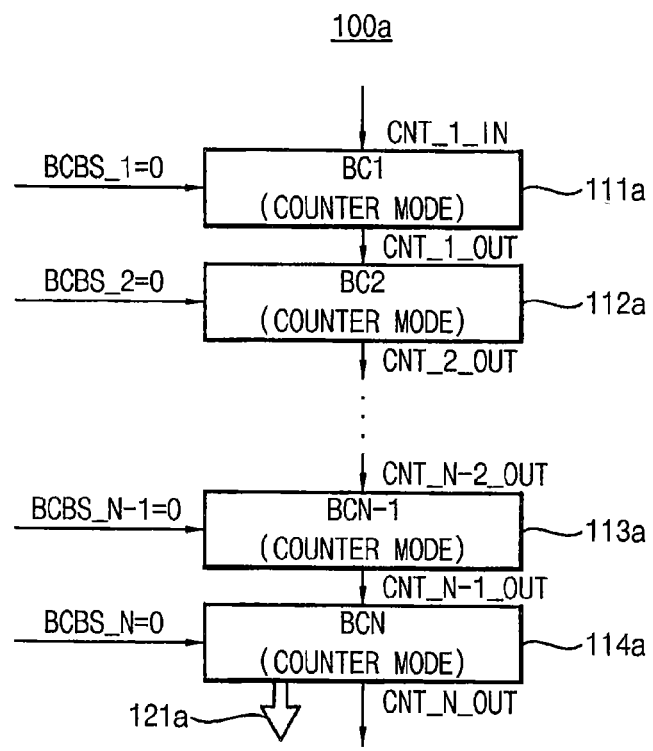
FIG. 2A is a block diagram illustrating operation of the counter circuit of FIG. 1 when all bit counters operate in a counter mode.
Figure 2B:
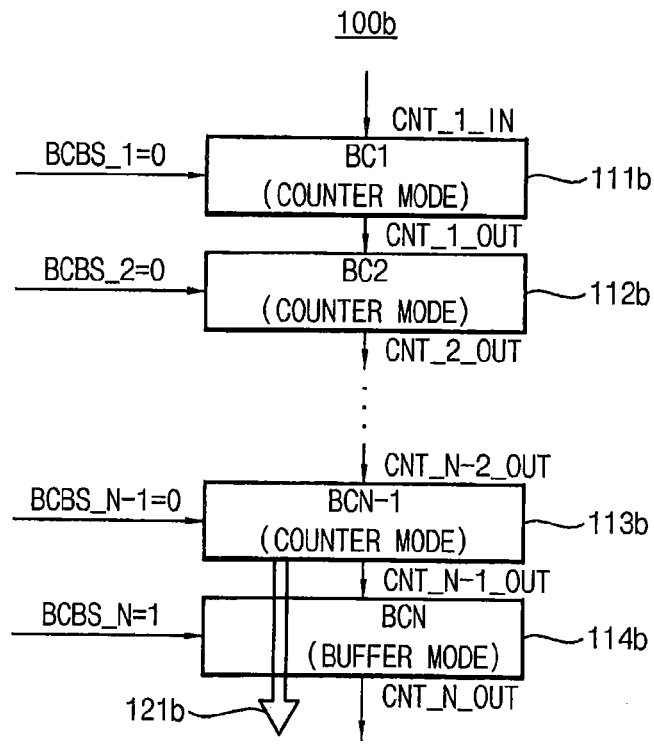
FIG. 2B is a block diagram illustrating operation of the counter circuit of FIG. 1 when a most significant bit counter operates in a buffer mode and other bit counters operate in the counter mode.
Figure 2C:
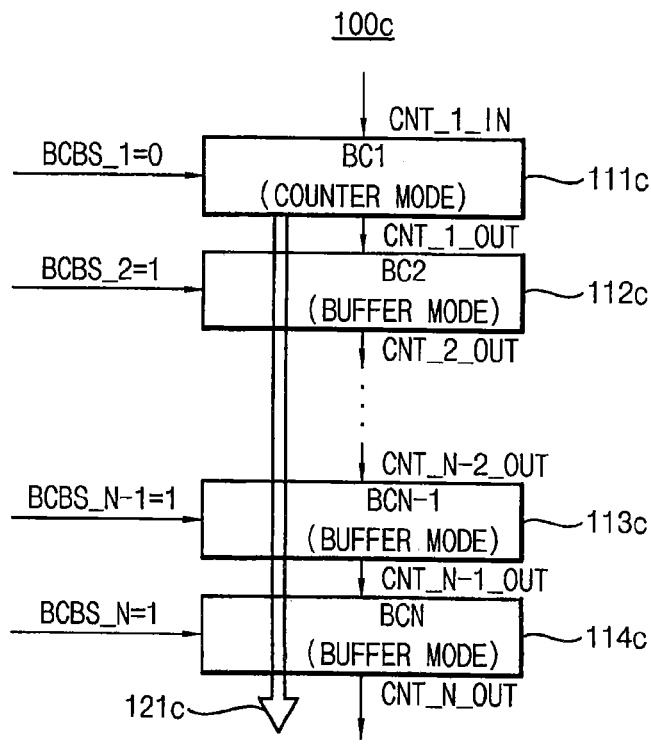
FIG. 2C is a block diagram illustrating operation of the counter circuit of FIG. 1 when a least significant bit counter operates in the counter mode and other bit counters operate in the buffer mode.

Operation of the counter circuit 100 will be further described with the reference to FIGS. 2A, 2B and 2C.

FIG. 2A is a block diagram illustrating operation of the counter circuit of FIG. 1 when all bit counters operate in a counter mode.

Referring to FIG. 2A, the bit counters 111*a*, 112*a*, 113*a*, and 114*a* operate in the counter mode when the first bypass control bit signal BCBS_1, the second bypass control bit signal BCBS_2, the (N−1)th bypass control bit signal BCBS_N−1, and the (N)th bypass control bit signal BCBS_N have logical value 0.

The counter circuit 100*a* outputs bit value corresponding to the MSB of the count value of the counter circuit 100*a* as the (N)th bit counter output signal CNT_N_OUT. The (N)th bit counter 114*a* may count the bit value corresponding to the MSB of the count value of the counter circuit 100*a*.

FIG. 2B is a block diagram illustrating operation of the counter circuit of FIG. 1 when a most significant bit counter operates in a buffer mode and other bit counters operate in the counter mode.

Referring to FIG. 2B, the first bit counter 111*b*, the second bit counter 112*b*, the (N−1)th bit counter 113*b* operate in the counter mode and the (N)th bit counter 114*b* operate in the buffer mode when the first bypass control bit signal BCBS_1, the second bypass control bit signal BCBS_2, and the (N−1)th bypass control bit signal BCBS_N−1 have logical value 0 and the (N)th bypass control bit signal BCBS_N has logical value 1.

The counter circuit 100*b* outputs the (N−1)th bit counter output signal CNT_N−1_OUT as the (N)th bit counter output signal CNT_N_OUT by bypassing 121*b* the (N)th bit counter 114*b*.

FIG. 2C is a block diagram illustrating operation of the counter circuit of FIG. 1 when a least significant bit counter operates in the counter mode and other bit counters operate in the buffer mode.

Referring to FIG. 2C, the first bit counter 111*c* operates in the counter mode and the second bit counter 112*c*, the (N−1)th bit counter 113*c*, and the (N)th bit counter 114*c* operate in the buffer mode when the first bypass control bit signal BCBS_1 has logic value 0 and the second bypass control bit signal BCBS_2, the (N−1)th bypass control bit signal BCBS_N−1, and the (N)th bypass control bit signal BCBS_N have logic value 1.

The counter circuit 100*c* outputs the first bit counter output signal CNT_1_OUT as the (N)th bit counter output signal CNT_N_OUT by bypassing 121*c* the second bit counter 112*c*, the (N−1)th bit counter 113*c*, and the (N)th bit counter 114*c*.

Figure 3:
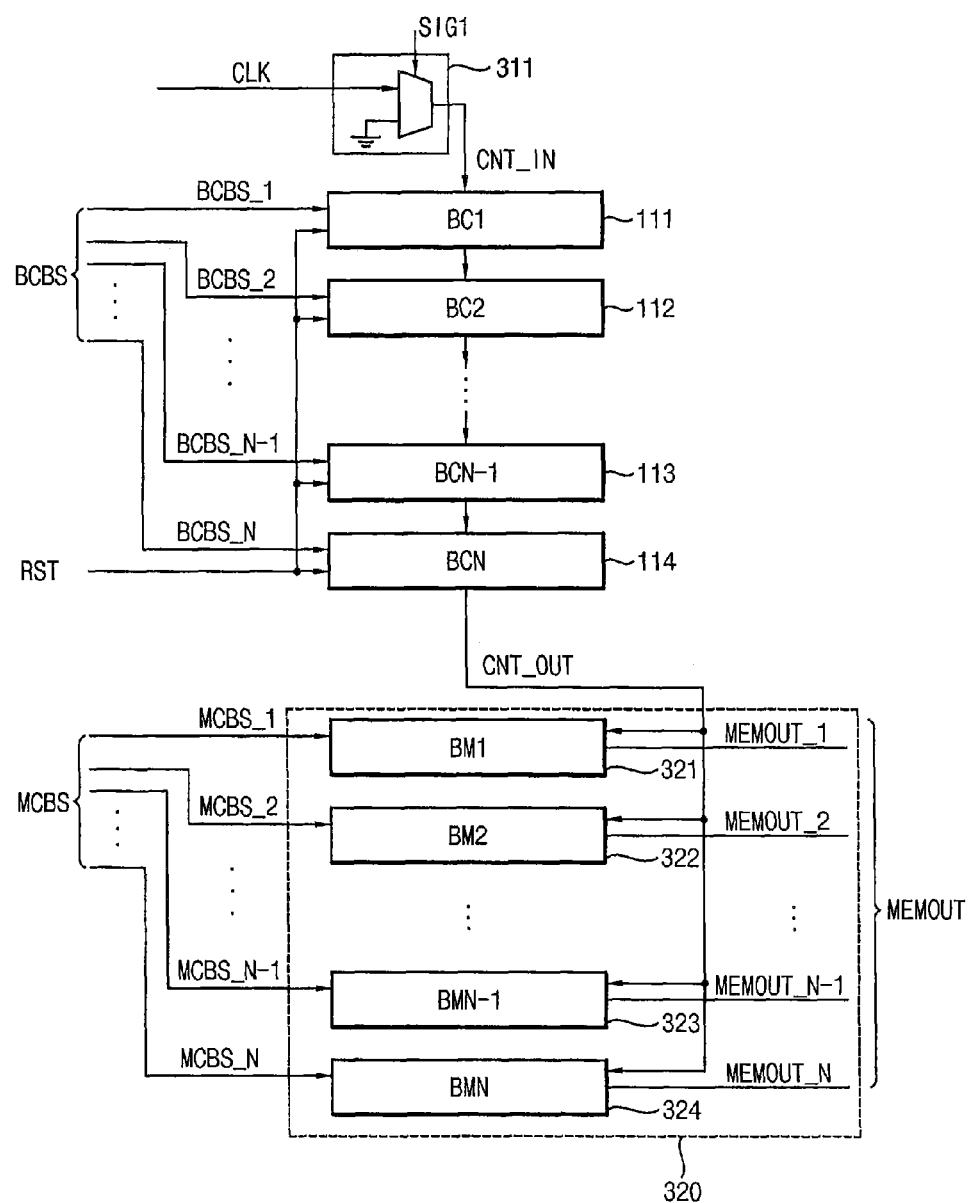
FIG. 3 is a block diagram illustrating a memory unit including the counter circuit of FIG. 1.

FIG. 3 is a block diagram illustrating a memory unit including the counter circuit of FIG. 1.

Referring to FIG. 3, the counter circuit 300 includes bit counters 111, 112, 113, and 114, an input controller 311, and the memory unit 320. The memory unit 320 includes bit memories 321, 322, 323, and 324.

Bit values of bit counters 111, 112, 113, and 114 may be reseted by a reset signal RST. Other components may be understood based on the description with the reference to FIG. 1.

The number of the bit memories 321, 322, 323, and 324 may be same as the number of the bit counters 111, 112, 113, and 114. Each of bit memories 321, 322, 323, and 324 receives the counter output signal CNT_OUT including each of bit value of the count value generated by each of the bit counters 111, 112, 113, and 114 sequentially.

Similar to the counter circuit 100*a* of FIG. 2A, the first bit counter 111, the second bit counter 112, the (N−1)th counter 113, and the (N)th bit counter 114 operate in the counter mode when the first bypass control bit signal BCBS_1, the second bypass control bit signal BCBS_2, the (N−1)th bypass control bit signal BCBS_N−1, and the (N)th bypass control bit signal BCBS_N has logical value 0. The counter output signal CNT_OUT including the output signal of the (N)th bit counter 114 may be stored in enabled (N)th bit memory BMN 324 when the (N)th memory control bit signal MCBS_N has logical value 1 and a first memory control bit signal MCBS_1, a second memory control bit signal MCBS_2, and the (N−1)th memory control bit signal MCBS_N−1 have logical value 0.

Similar to the counter circuit 100*b* of FIG. 2B, the first bit counter 111, the second bit counter 112, and the (N−1)th bit counter 113 operate in the counter mode and the (N)th bit counter 114 operates in the buffer mode when the first bypass control bit signal BCBS_1, the second bypass control bit signal BCBS_2, and the (N−1)th bypass control bit signal BCBS_N−1 have logical value 0 and the (N)th bypass control bit signal BCBS_N has logical value 1. The counter output signal CNT_OUT including the output signal of the (N−1)th bit counter 113 may be stored in enabled (N−1)th bit memory BMN−1 323 when the (N−1)th memory control bit signal MCBS_N−1 has logical value 1 and the first memory control bit signal MCBS_1, the second memory control bit signal MCBS_2, and the (N)th memory control bit signal MCBS_N have logical value 0.

Similar to the counter circuit 100*c* of FIG. 2C, the first bit counter 111 operates in the counter mode and the second bit counter 112, the (N−1)th bit counter 113, and the (N)th bit counter 114 operate in the buffer mode when the first bypass control bit signal BCBS_1 has logical value 0 and the second bypass control bit signal BCBS_2, the (N−1)th bypass control bit signal BCBS_N−1, and the (N)th bypass control bit signal BCBS_N has logical value 1. The counter output signal CNT_OUT including the output signal of the first bit counter 111 may be stored in enabled first bit memory BM1 321 when the first memory control bit signal MCBS_1 has logical value 1 and the second memory control bit signal MCBS_2, the (N−1)th memory control bit signal MCBS_N−1, and the (N)th memory control bit signal MCBS_N have logical value 0.

The bit memories 321, 322, 323, and 324 output stored values through a memory output line MEM_OUT sequentially.

The input controller 311 may include a multiplexer. The multiplexer outputs either a clock signal CLK or ground voltage as the counter input signal CNT_IN in response to the first signal SIG1.

Figure 4:
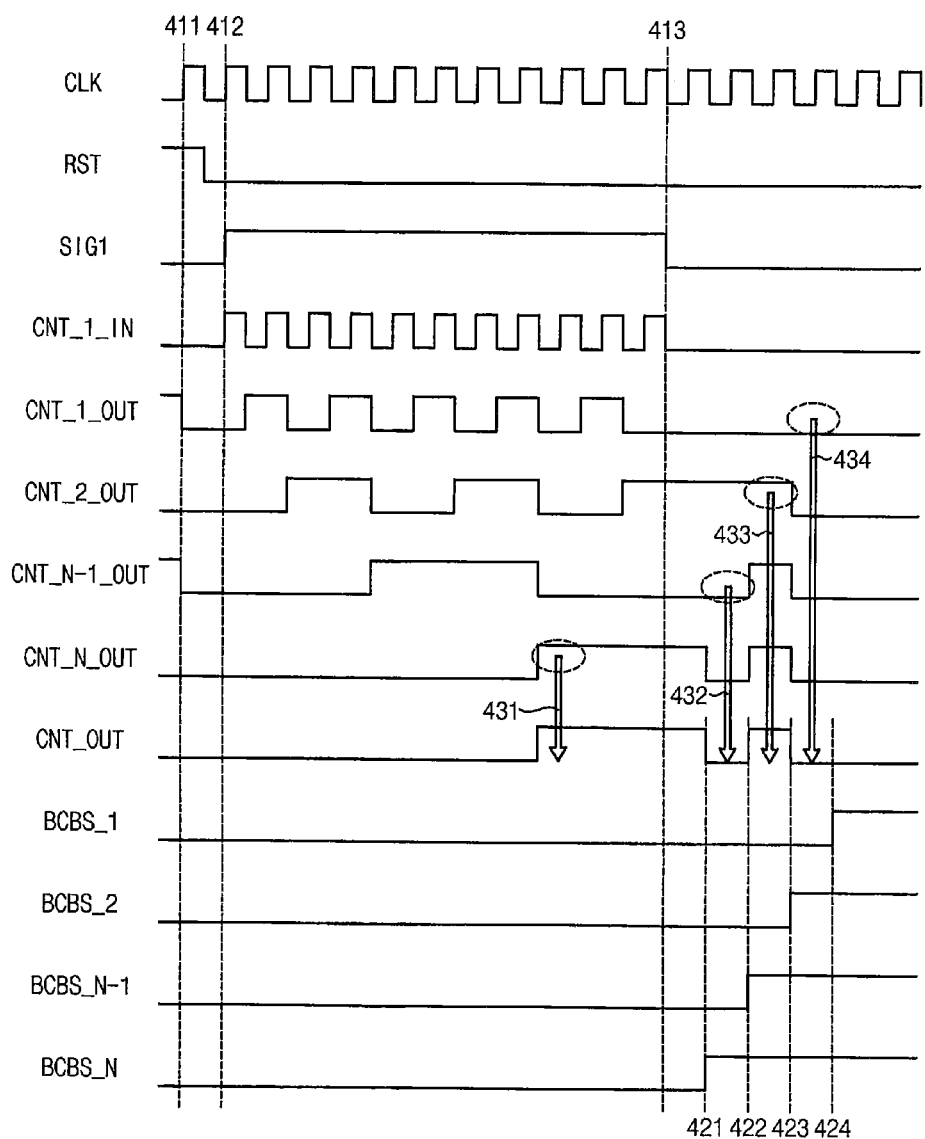
FIGS. 4 and 5 are timing diagrams illustrating operation of the counter circuit of FIG. 1.
Figure 5:
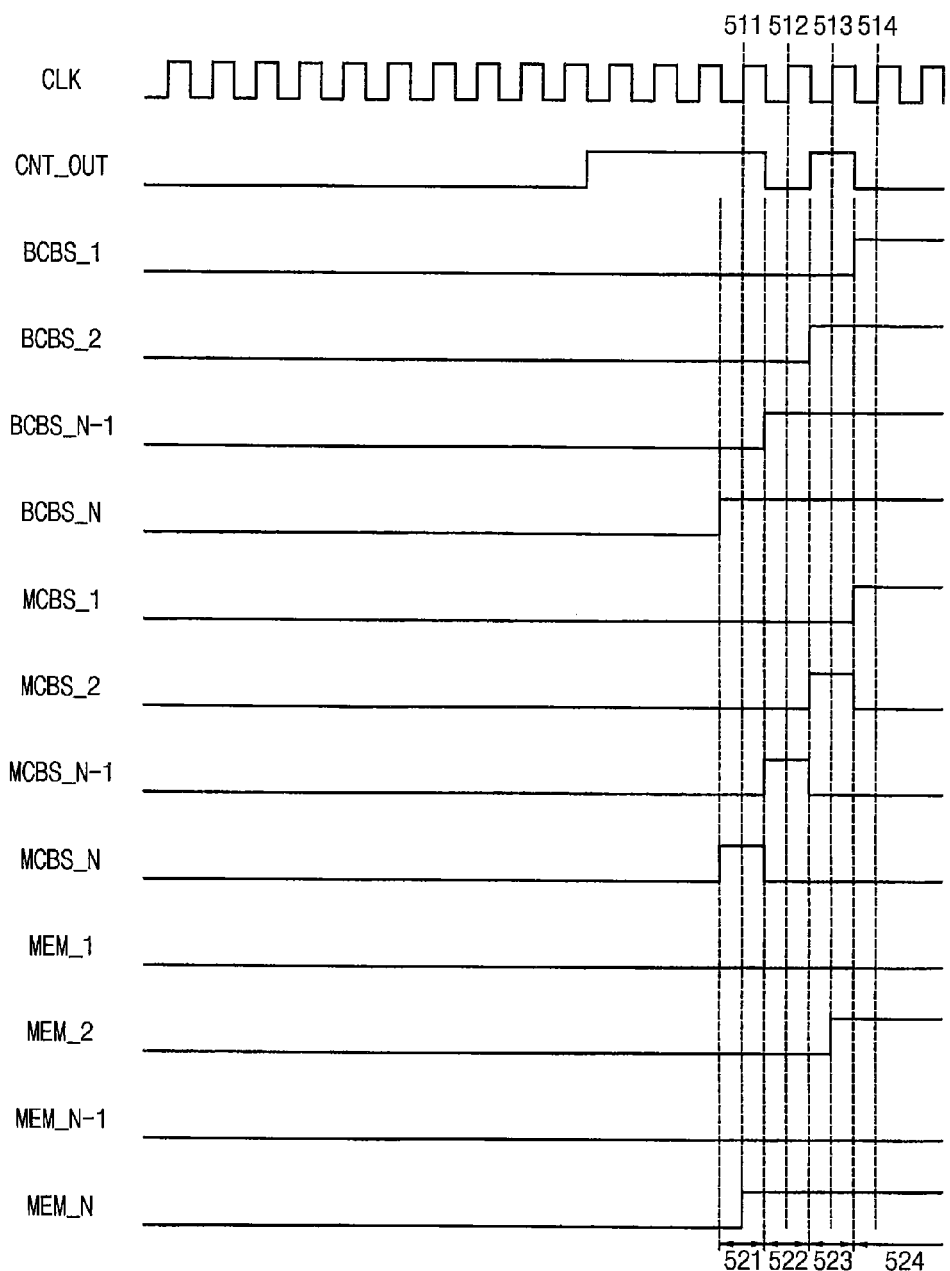

FIGS. 4 and 5 are timing diagrams illustrating operation of the counter circuit of FIG. 1. FIG. 4 describes operation of the counter circuit 300 when N is 4.

Referring to FIG. 4, the counter circuit 300 resets the count value of the bit counters 111, 112, 113, and 114 based on a reset signal RST which is enabled at a first rising edge 411 of the clock signal CLK. The first bit counter output signal CNT_1_OUT and the (N−1)th bit counter output signal CNT_N−1_OUT are reseted from logical value 1 to logical value 0 at the first rising edge. The second bit counter output signal CNT_2_OUT and the (N)th bit counter output signal CNT_N_OUT remain logical value 0.

The input controller 311 outputs the clock signal CLK as the counter input signal CNT_IN when the first signal SIG1 has logical value 1. The input controller 311 outputs logical value 0 as the counter input signal CNT_IN when the first signal SIG1 has logical value 0. The input controller 311 outputs the clock signal CLK as the counter input signal CNT_IN during a period from a second rising edge 412 to a falling edge 413 when the first signal SIG1 remains logical value 1. The input controller 311 outputs the logical value 0 as the counter input signal CNT_IN during other period.

Each of the bit counters 111, 112, 113, and 114 toggles each of bit values of the count value at a falling edge of a received signal. The first bit counter output signal CNT_1_OUT is toggled at a falling edge of the first bit counter input signal CNT_1_IN. The first bit counter 111 corresponds to LSB of the count value. The second bit counter output signal CNT_2_OUT is toggled at the falling edge of the first bit counter output signal CNT_1_OUT. The second bit counter 112 corresponds to a bit which is one bit higher than LSB of the count value. The (N−1)th bit counter output signal CNT_N−1_OUT is toggled at a falling edge of the second bit count output signal CNT_2_OUT. The (N−1)th bit counter 113 corresponds to a bit which is one bit lower than MSB of the count value. The (N)th bit counter output signal CNT_N_OUT is toggled at a falling edge of the (N−1)th bit counter output signal CNT_N−1_OUT. The (N)th bit counter 114 corresponds to a bit which is MSB of the count value.

The first bit counter 111 operates in the counter mode from the second rising edge 412 of the clock signal CLK to a rising edge 424 of the first bypass control bit signal BCBS_1. The first bit counter 111 operates in the buffer mode after the rising edge 424 of the first bypass control bit signal BCBS_1. The second bit counter 112 operates in the counter mode from the second rising edge 412 of the clock signal CLK to a rising edge 423 of the second bypass control bit signal BCBS_2. The second bit counter 112 operates in the buffer mode after the rising edge 423 of the second bypass control bit signal BCBS_2. The (N−1)th bit counter 113 operates in the counter mode from the second rising edge 412 of the clock signal CLK to a rising edge 422 of the (N−1)th bypass control bit signal BCBS_N−1. The (N−1)th bit counter 113 operates in the buffer mode after the rising edge 422 of the (N−1)th bypass control bit signal BCBS_N−1. The (N)th bit counter 114 operates in the counter mode from the second rising edge 412 of the clock signal CLK to a rising edge 421 of the (N)th bypass control bit signal BCBS_N. The (N)th bit counter 114 operates in the buffer mode after the rising edge 421 of the (N)th bypass control bit signal BCBS_N.

The counter circuit 300 outputs the (N)th bit counter output signal CNT_N_OUT as the counter output signal CNT_OUT because the bit counters 111, 112, 113, and 114 operates in the counter mode before the rising edge 421 of the (N)th bypass control bit signal BCBS_N. The counter output signal CNT_OUT is reseted as logical value 0 which is logical value of reseted (N)th bit counter output signal CNT_N_OUT. The logical value of the counter output signal CNT_OUT rises from logical value 0 to logical value 1 at a rising edge 431 of the (N)th bit counter output signal CNT_N_OUT.

The first bit counter 111, the second bit counter 112, and the (N−1)th bit counter 113 operates in the counter mode and the (N)th bit counter 114 operates in the buffer mode from the rising edge 421 of the (N)th bypass control bit signal BCBS_N to the rising edge 422 of the (N−1)th bypass control bit signal BCBS_N−1. The counter circuit 300 outputs logical value 0 which is the (N−1)th bit counter output signal CNT_N−1_OUT as the counter output signal CNT_OUT by bypassing 432 the (N)th bit counter 114.

The first bit counter 111 and the second bit counter 112 operate in the counter mode and the (N−1)th bit counter 113 and the (N)th bit counter 114 operate in the buffer mode from the rising edge 422 of the (N−1)th bypass control bit signal BCBS_N−1 to the rising edge 423 of the second bypass control bit signal BCBS_2. The counter circuit 300 outputs logical value 1 which is the second bit counter output signal CNT_2_OUT as the counter output signal CNT_OUT by bypassing 433 the (N−1)th bit counter 113 and the (N)th bit counter 114.

The first bit counter 111 operates in the counter mode and the second bit counter 112, the (N−1)th bit counter 113, and the (N)th bit counter 114 operate in the buffer mode from the rising edge 423 of the second bypass control bit signal BCBS_2 to the rising edge 424 of the first bypass control bit signal BCBS_1. The counter circuit 300 outputs logical value 0 which is the first bit counter output signal CNT_1_OUT as the counter output signal CNT_OUT by bypassing 434 the second bit counter 112, the (N−1)th bit counter 113, and the (N)th bit counter 114.

Referring to FIG. 5, the (N)th memory control bit signal MCBS_N remains logical value 1 during period 521 when the (N)th bit counter 114 operates in the counter mode. The (N)th memory control bit signal MCBS_N has logical value 0 during other period. The (N−1)th memory control bit signal MCBS_N−1 remains logical value 1 during period 522 when the (N−1)th bit counter 113 operates in the counter mode and the (N)th bit counter 114 operates in the buffer mode. The second memory control bit signal MCBS_2 remains logical value 1 during period 523 when the second bit counter 112 operates in the counter mode and the (N−1)th bit counter 113 and the (N)th bit counter 114 operate in the buffer mode. The second memory control bit signal MCBS_2 has logical value 0 during other period. The first memory control bit signal MCBS_1 remains logical value 1 during period 524 when the first bit counter 111 operates in the counter mode and the second bit counter 112, the (N−1)th bit counter 113, and the (N)th bit counter 114 operate in the buffer mode. The first memory control bit signal MCBS_1 has logical value 0 during other period.

A stored value MEM_N of the (N)th bit memory 324 at a first rising edge 511 of the clock signal CLK is logical value 1 which is the counter output signal CNT_OUT at the first rising edge 511. The (N)th memory control bit signal MCBS_N has logical value 1 at the first rising edge 511. A stored value MEM_N-1 of the (N-1)th bit memory 323 at a second rising edge 512 of the clock signal CLK is logical value 0 which is the counter output signal CNT_OUT at the second rising edge 512. The (N-1)th memory control bit signal MCBS_N-1 has logical value 1 at the second rising edge 512. A stored value MEM_2 of the second bit memory 322 at a third rising edge 513 of the clock signal CLK is logical value 1 which is the counter output signal CNT_OUT at the third rising edge 513. The second memory control bit signal MCBS_2 has logical value 1 at the third rising edge 513. A stored value MEM_1 of the first bit memory 321 at a fourth rising edge 514 of the clock signal CLK is logical value 0 which the counter output signal CNT_OUT at the fourth rising edge 514. The first memory control bit signal MCBS_1 has logical value 1 at the fourth rising edge 514.

Figure 6:
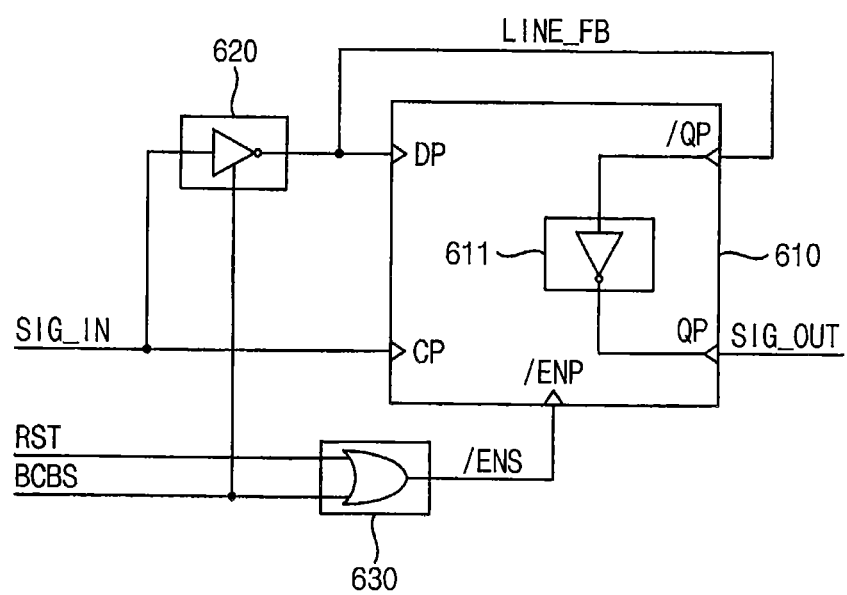
FIG. 6 is a block diagram illustrating a bit counter bypassing a received signal selectively included in the counter circuit of FIG. 1.

FIG. 6 is a block diagram illustrating a bit counter bypassing a received signal selectively included in the counter circuit of FIG. 1. Referring to FIG. 6, a bit counter bypassing a received signal selectively 600 includes an enable controller 630, a first inverting unit 620, a flip-flop 610, and a feedback signal line LINE_FB. The flip-flop 610 may be a data flip-flop and include a second inverting unit 611. The first inverting unit 620 may include a tri-state inverter. The second inverting unit 611 may include an inverter. The enable controller 630 may include OR gate. The enable controller 630 receives a bypass control bit signal BCBS and the reset signal RST and outputs an inverted enable signal/ENS using OR gate.

An input port of the first inverting unit 620 and an output port of the first inverting unit 620 are disconnected electrically when the bypass control bit signal BCBS has logical value 0. The first inverting unit 620 inverts a received signal SIG_IN of the first inverting unit 620 and outputs the inverted received signal when the bypass control bit signal BCBS has logical value 1.

A data (D) flip-flop includes a data signal port DP electrically connected to an inverted output signal port/QP, a clock signal port CP receiving the received signal SIG_IN, an inverted enable signal port/ENP receiving the inverted enable signal/ENS, and an output signal port QP outputting the stored value in the data flip-flop. A bit counter output signal SIG_OUT is electrically connected to the output signal port QP. The feedback signal line LINE_FB connects electrically the inverted output signal port/QP of the data flip-flop and the data signal port DP. The second inverting unit 611 inverts a received signal from the inverted output signal port/QP and outputs the inverted received signal to the output signal port QP. The second inverting unit 611 may include inverter. The inverter may be embodied by a NAND gate or a NOR gate. Structure of the D flip-flop 610 will be described with the reference to FIG. 7. Equivalent circuits according to value of the bypass control bit signal BCBS will be described with the reference to FIGS. 8A and 8B.

Thus, as described hereinabove with respect to FIGS. 1-6, an integrated circuit counter 100 according to embodiment of the invention can include a cascaded chain of bit counters (111-114) collectively configured to count a number of first edges of a counter input signal (CNT_IN) received at an input thereof and output the count as a counter output signal (CNT_OUT). As shown by these figures, the cascaded chain includes at least two bit counters, which are configured to support both counter and buffer modes of operation and responsive to respective bypass control bit signals (BCBS_1 through BCBS_N) having values that specify whether a corresponding one of the at least two bit counters is disposed in the counter or buffer mode of operation. According to some of these embodiments of the invention, a most significant one of the cascaded chain of bit counters is configured to output the counter output signal (CNT_N_OUT) as a sequential stream of bits. The cascaded chain of bit counters may further be configured to support one or more bit counters in the counter mode of operation concurrently with one or more bit counters in the buffer mode of operation.

According to some of these embodiments of the invention, at least one of the at least two bit counters can include a flip-flop 610 and a feedback signal line LINE_FB directly connecting one of the input ports (e.g., DP) of the flip-flop 610 to one of the output ports (e.g.,/QP) of the flip-flop 610. According to additional embodiments of the invention, at least one of the at least two bit counters includes a data flip-flop 610 having a clock signal port (e.g., CP) and a data signal port (e.g., DP), and an inverter 620 having an enable terminal responsive to a corresponding bypass control bit signal (BCBS). This inverter 620 may have an input terminal connected to the clock signal port (CP), which is responsive to an input signal (SIG_IN), and an output terminal connected to the data signal port (DP).

Figure 7:
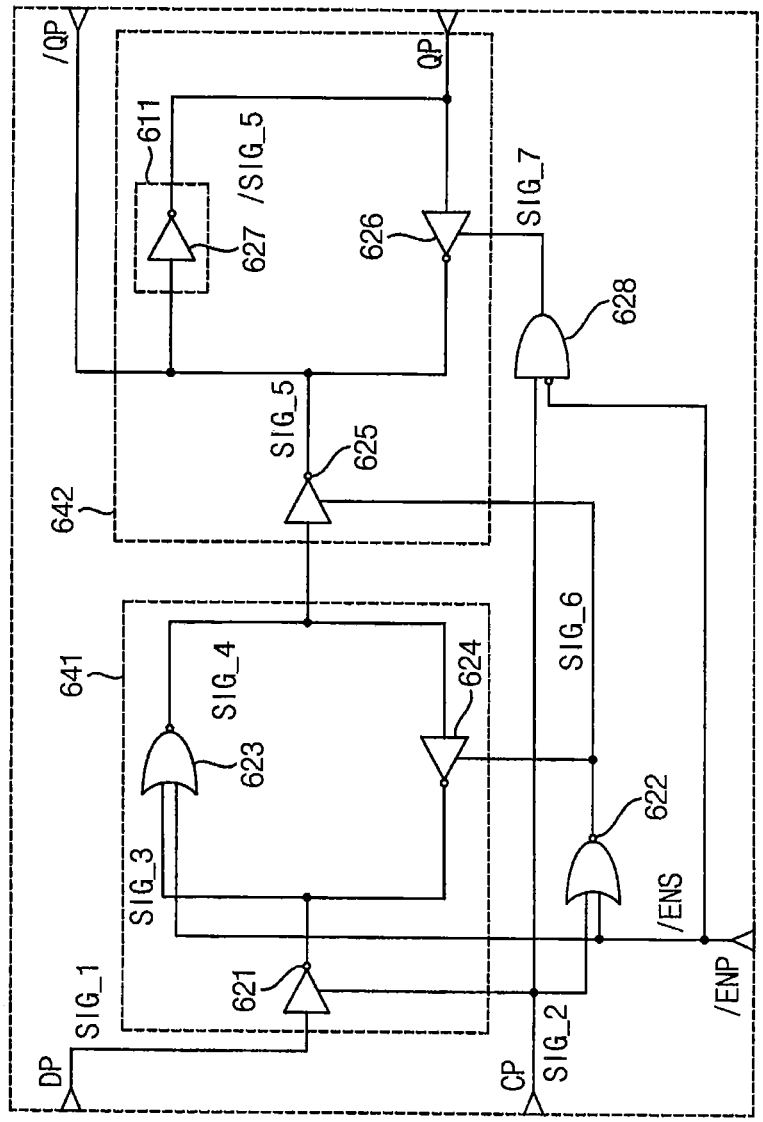
FIG. 7 is a block diagram illustrating an example of a data flip-flop included in the bit counter of FIG. 6.

FIG. 7 is a block diagram illustrating an example of a data flip-flop included in the bit counter of FIG. 6.

Referring to FIG. 7, the D flip-flop 610 includes and data signal port DP, a clock signal port CP, an inverted enable signal port/ENP, an inverted output signal port/QP, and an output signal port QP. The D flip-flop 610 includes the plurality of tri-inverters 621, 624, 625, and 626. The D flip-flop 610 includes NOR gates 622, 623 and a logic gate 628. The second inverting unit 611 includes an inverter 627.

A tri-state inverter 621 receives a first signal SIG_1 through the data signal port DP and receives a second signal SIG_2 through the clock signal port CP. An input port of the tri-state inverter 621 and an output port of the tri-state inverter 621 are electrically disconnected when the second signal SIG_2 has logical value 0. The tri-state inverter 621 inverts the first signal SIG_1 and outputs the inverted first signal as a third signal SIG_3 when the second signal SIG_2 has logical value 1.

The NOR gate 623 outputs logical value 0 as a fourth signal SIG_4 when the inverted enable signal/ENS or the third signal SIG_3 has logical value 1. The NOR gate 623 outputs logical value 1 as the fourth signal SIG_4 when the inverted enable signal/ENS and the third signal SIG_3 have logical value 0.

The NOR gate 622 outputs logical value 0 as a sixth signal SIG_6 when the second signal SIG_2 or the inverted enable signal/ENS has logical value 1. The NOR gate 622 outputs logical value 1 as the sixth signal SIG_6 when the second signal SIG_2 and the inverted enable signal/ENS have logical value 0.

The tri-state inverter 624 receives the fourth signal SIG_4 and the sixth signal SIG_6. An input port of the tri-state inverter 624 and an output port of the tri-state inverter 624 are electrically disconnected when the sixth signal SIG_6 has logical value 0. The tri-state inverter 624 inverts the fourth signal SIG_4 and outputs the inverted fourth signal as the third signal SIG_3 when the sixth signal SIG_6 has logical value 1.

The tri-state inverter 621 inverts the first signal SIG_1 and outputs the inverted first signal as the third signal SIG_3, the tri-state inverter 624 operates as an open circuit, the NOR gate 623 operates as an inverter, and the fourth signal SIG_4 has the value of the first signal SIG_1 when the second signal SIG_2 has logical value 1 and the inverted enable signal/ENS has logical value 0.

The fourth signal SIG_4 is fixed to logical value 0 when the second signal SIG_2 has logical value 1 and the inverted enable signal/ENS has logical value 1.

The tri-state inverter 621 operates as an open circuit, the tri-state inverter 624 inverts the fourth signal SIG_4 and outputs the inverted fourth signal as the third signal SIG_3, the NOR gate 623 operates as an inverter, and the NOR gate 623 and the tri-state inverter 624 comprise a loop storing the third signal SIG_3 and the fourth signal SIG_4 when the second signal SIG_2 has logical value 0 and the inverted enable signal/ENS has logical value 0.

The fourth signal SIG_4 is fixed to logical value 1 when the second signal SIG_2 has logical value 0 and the inverted enable signal/ENS has logical value 1.

The tri-state inverter 625 receives the fourth signal SIG_4 and the sixth signal SIG_6. An input port of the tri-state inverter 625 and an output port of the tri-state inverter 625 are electrically disconnected when the sixth signal SIG_6 has logical value 0. The tri-state inverter 625 inverts the fourth signal SIG_4 and outputs the inverted fourth signal as a fifth signal SIG_5 when the sixth signal has logical value 1.

An inverter 627 included in the second inverting unit 611 inverts the fifth signal SIG_5 and outputs an inverted fifth signal/SIG_5.

The logic gate 628 receives the second signal SIG_2 and the inverted enable signal/ENS. The logic gate 28 outputs logical value 1 as a seventh signal SIG_7 when the second signal SIG_2 has logical value 1 and the inverted enable signal has logical value 0. The logic gate 628 outputs logical value 0 as the seventh signal SIG_7 when the second signal SIG_2 has logical value 0 or the inverted enable signal/ENS has logical value 1.

The tri-state inverter 626 receives the inverted fifth signal/SIG_5 and the seventh signal SIG_7. An input port of the tri-state inverter 626 and an output port of the tri-state inverter 626 are electrically disconnected when the seventh signal SIG_7 has logical value 0. The tri-state inverter 626 inverts the inverted fifth signal/SIG_5 and generates the fifth signal SIG_5 when the seventh signal SIG_7 has logical value 1.

The flip-flop 610 outputs the fifth signal SIG_5 through the inverted output signal port/QP. The flip-flop 610 outputs the inverted fifth signal/SIG_5 through the output signal port QP.

The tri-state inverter 625 inverts the fourth signal SIG_4 and outputs the inverted fourth signal as the fifth signal SIG_5, the tri-state inverter 626 operates as an open circuit, and the inverted fifth signal/SIG_5 has a value of the fourth signal SIG_4 when the sixth signal SIG_6 has logical value 1.

The tri-state inverter 625 operates as an open circuit, the tri-state inverter 626 inverts the inverted fifth signal/SIG_5 and generates the fifth signal SIG_5, and the inverter 627 and the tri-state inverter 626 comprise a loop storing the fifth signal SIG_5 and the inverted fifth signal/SIG_5 when the sixth signal SIG_6 has logical value 0.

A first circuit 641 resets the fourth signal SIG_4 to logical value 0 when the inverted enable signal/ENS has logical value 1. The first circuit 641 stores the value of the first signal SIG_1 at a first rising edge of the second signal SIG_2 as the fourth signal SIG_4 when the inverted enable signal has logical value 0. A second circuit 642 stores the value of the fourth signal SIG_4, the stored value of the first circuit 641, at a second rising edge which is a next rising edge after the first rising edge of the second signal SIG_2.

The inverted enable signal/ENS has logical value 1, the first circuit 641 outputs logical value 0 as the fourth signal SIG_4, the tri-state inverters 624, 625 operate as open circuits, the second inverting unit 611 inverts the fifth signal SIG_5 of the inverted output signal port/QP and outputs the inverted fifth signal/SIG_5 through the output signal port QP when the bypass control bit signal BCBS has logical value 1. In other words, the input port of the tri-state inverter 625 and the output port of the tri-state inverter 625 are electrically disconnected, and the bit counter 610 inverts the signal of the inverted output signal port/QP by the second inverting unit 611 and outputs the inverted signal through the output signal port QP when the bypass control bit signal BCBS has logical value 1.

Figure 8A:
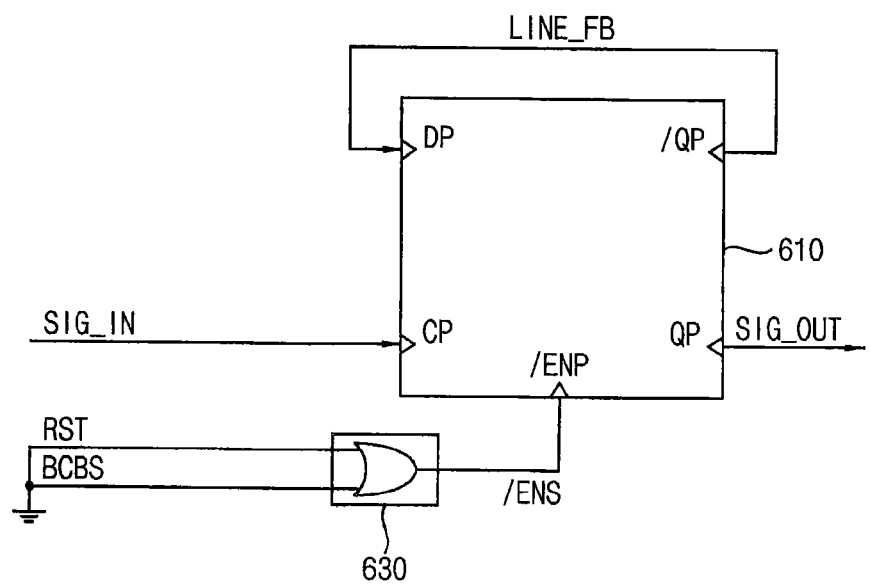
FIGS. 8A and 8B are equivalent circuits of the bit counter of FIG. 6.
Figure 8B:
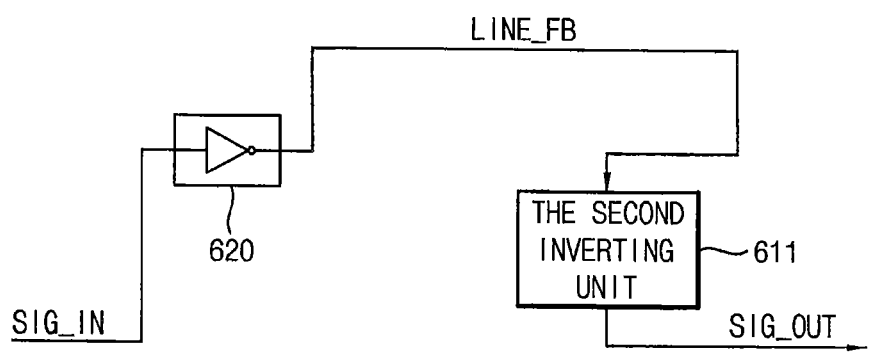

FIGS. 8A and 8B are equivalent circuits of the bit counter of FIG. 6.

Referring to FIG. 8A, the inverted enable signal/ENS has logical value 0 and the D flip-flop 610 when the bypass control bit signal BCBS has logical value 0 and the reset signal RST has logical value 0. The feedback signal line LINE_FB electrically connects the inverted output signal port/QP and the data signal port DP. A bit counter 600a, an equivalent circuit of the bit counter 600 when the bypass control bit signal BCBS has logical value 0, toggles the stored value of the D flip-flop 610 at every falling edge of the received signal SIG_IN when the bypass control bit signal BCBS has logical value 0.

Referring to FIG. 8B, the inverted enable signal/ENS has logical value 1 and the D flip-flop 610 doesn't keep the stored value when the bypass control bit signal BCBS has logical value 1 and the reset signal RST has logical value 0. In this case, the received signal SIG_IN is inverted by the first inverting unit 620 and the inverted received signal is inputted to the second inverting unit 611 through the feedback signal line LINE_FB. The second inverting unit 611 re-inverts the inverted received signal and outputs the same signal as the received signal as the output signal SIG_OUT. A bit counter 600b, an equivalent circuit of the bit counter 600 when the bypass control bit signal BCBS has logical value 1, bypasses the received signal SIG_IN as the output signal SIG_OUT through the first inverting unit 620 and the second inverting unit 611 operating as buffers.

Figure 9:
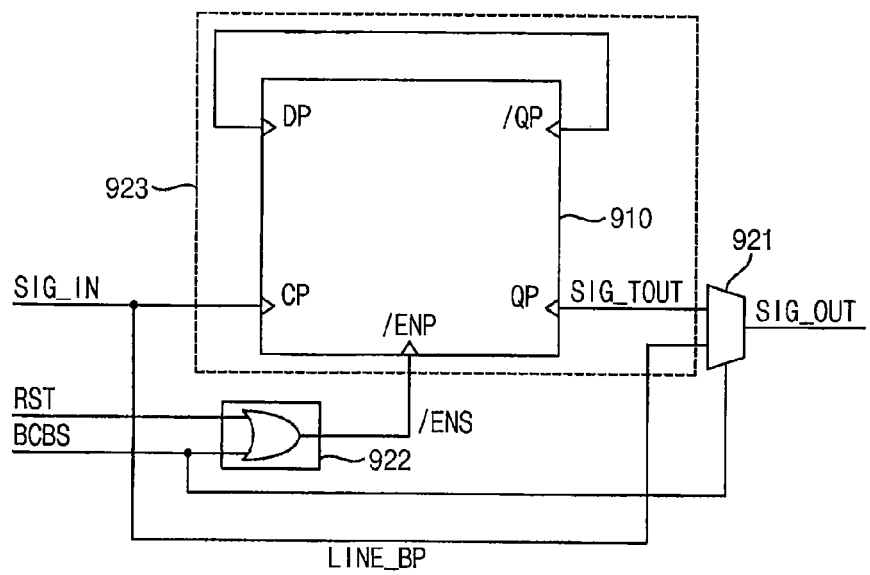
FIGS. 9 through 11 are block diagrams illustrating bit counters bypassing the received signal selectively included in the counter circuit of FIG. 1.
Figure 10:
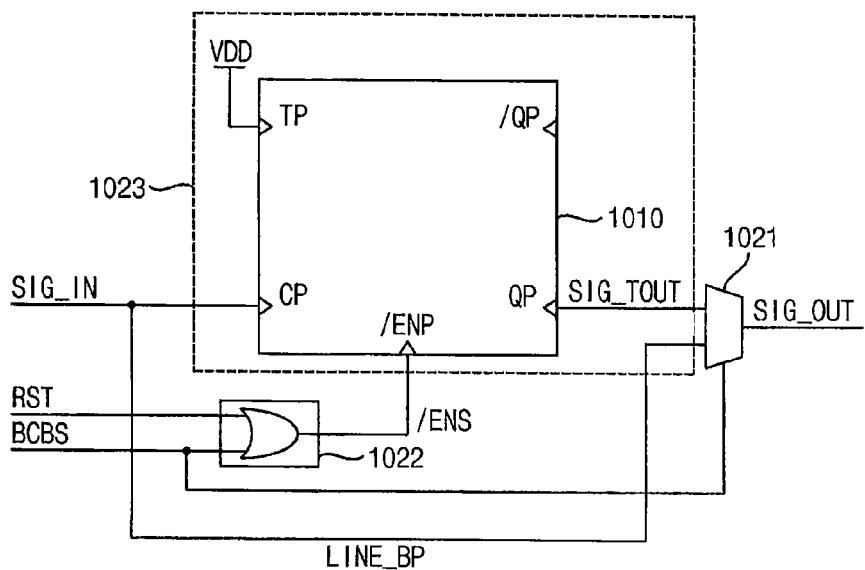
Figure 11:
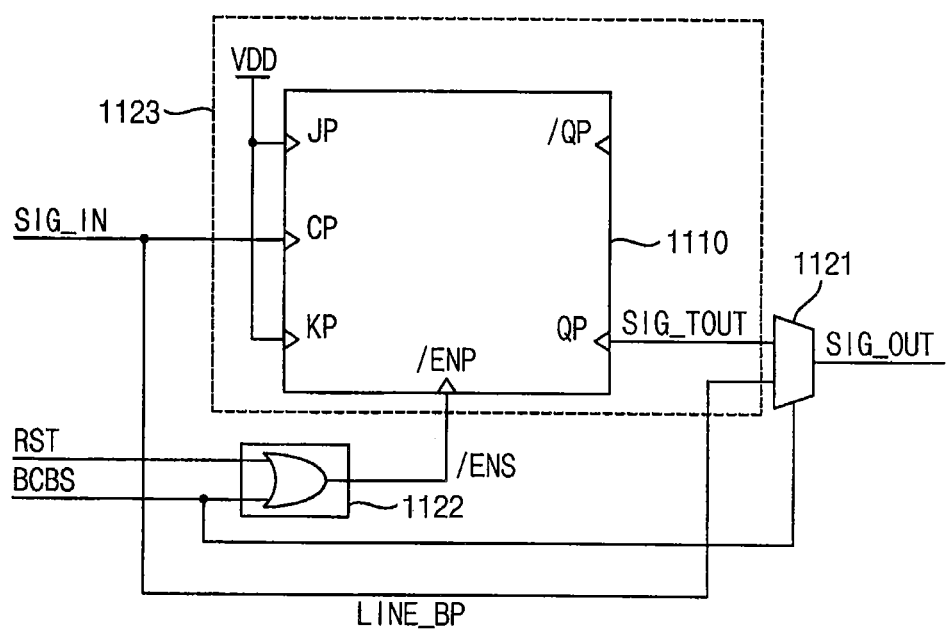

FIGS. 9 through 11 are block diagrams illustrating bit counters bypassing the received signal selectively included in the counter circuit of FIG. 1.

Referring to FIG. 9, a bit counter 900 includes a toggle unit 923, an enable controller 922, a bypass signal line LINE_BP, and a multiplexer 921. The enable controller 922 may include an OR gate. The toggle unit 923 may include a data (D) flip-flop 910. The enable controller 922 outputs an inverted enable signal/ENS by NORing a bypass control bit signal BCBS and a reset signal RST. The toggle unit 923 inverts a stored value at a falling edge of a received signal when the inverted enable signal/ENS has logical value 0. The toggle unit 923 outputs the inverted stored value as an output signal SIG_TOUT.

The D flip-flop 910 includes a data signal port DP electrically connected to an inverted output signal port/QP, a clock signal port CP receiving the received signal SIG_IN, an inverted enable signal port receiving the inverted enable signal/ENS, and an output signal port QP outputting the toggle output signal SIG_TOUT.

The bypass signal line LINE_BP transfers the received signal SIG_IN to the multiplexer 921 by bypassing the toggle unit 923.

The multiplexer 921 outputs the toggle output signal SIG_TOUT as the output signal SIG_OUT when the bypass control bit signal BCBS has logical value 0. The multiplexer 921 outputs the received signal SIG_IN of the bypass signal line LINE_BP as the output signal SIG_OUT when the bypass control bit signal BCBS has logical value 1.

The stored value of the D flip-flop 910 is reseted to logical value 0 when the reset signal has logical value 1.

The bit counter 900 toggles the stored value of the D flip-flop 910 at every falling edge of the received signal SIG_IN and outputs the stored value as the output signal SIG_OUT when the reset signal RST has logical value 0 and the bypass control bit signal BCBS has logical value 0.

Toggle unit 923 of the bit counter 900 doesn't execute a toggling operation when the reset signal RST has logical value 0 and the bypass control bit signal BCBS has logical value 1. The bit counter 900 bypasses the received signal SIG_IN as the output signal SIG_OUT through the bypass signal line LINE_BP.

Referring to FIG. 10, a bit counter 1000 includes a toggle unit 1023, an enable controller 1022, a bypass signal line LINE_BP, and a multiplexer 1021. The enable controller 1022 may include an OR gate. The toggle unit 1023 may include a T flip-flop 1010.

The bit counter 1000 without the toggle unit 1023 is same as the bit counter 900 of the FIG. 9.

The toggle unit 1023 inverts a stored value at a falling edge of a received signal SIG_IN and outputs the inverted stored value as a output signal SIG_OUT when an inverted enable signal/ENS has logical value 0.

The T flip-flop 1010 includes a toggle port TP electrically connected to driving voltage (VDD), logical value 1, a clock signal port CP receiving the received signal SIG_IN, an inverted enable signal port/ENP receiving the inverted enable signal/ENS, and an output signal port QP outputting the toggle output signal SIG_TOUT. Operation of the bit counter 1000 may be understood based on the reference to FIG. 9.

Referring to FIG. 11, a bit counter 1100 includes a toggle unit 1023, an enable controller 1122, a bypass signal line LINE_BP, and a multiplexer 1121. The enable controller 1122 may includes an OR gate. The toggle unit 1123 may includes a JK flip-flop 1110.

The bit counter 1100 without the toggle unit 1123 is same as the bit counter 900 of the FIG. 9.

The toggle unit 1123 inverts a stored value at a falling edge of a received signal SIG_IN and outputs the inverted stored value as a output signal SIG_OUT when an inverted enable signal/ENS has logical value 0.

The JK flip-flop 1110 includes a J port JP electrically connected to VDD and a K port KP electrically connected to VDD, a clock signal port receiving the received signal SIG_IN, an inverted enable signal port/ENP receiving the inverted enable signal/ENS, and an output signal port QP outputting the toggle output signal SIG_TOUT. Operation of the bit counter 1100 may be understood based on the reference to FIG. 9.

Figure 12:
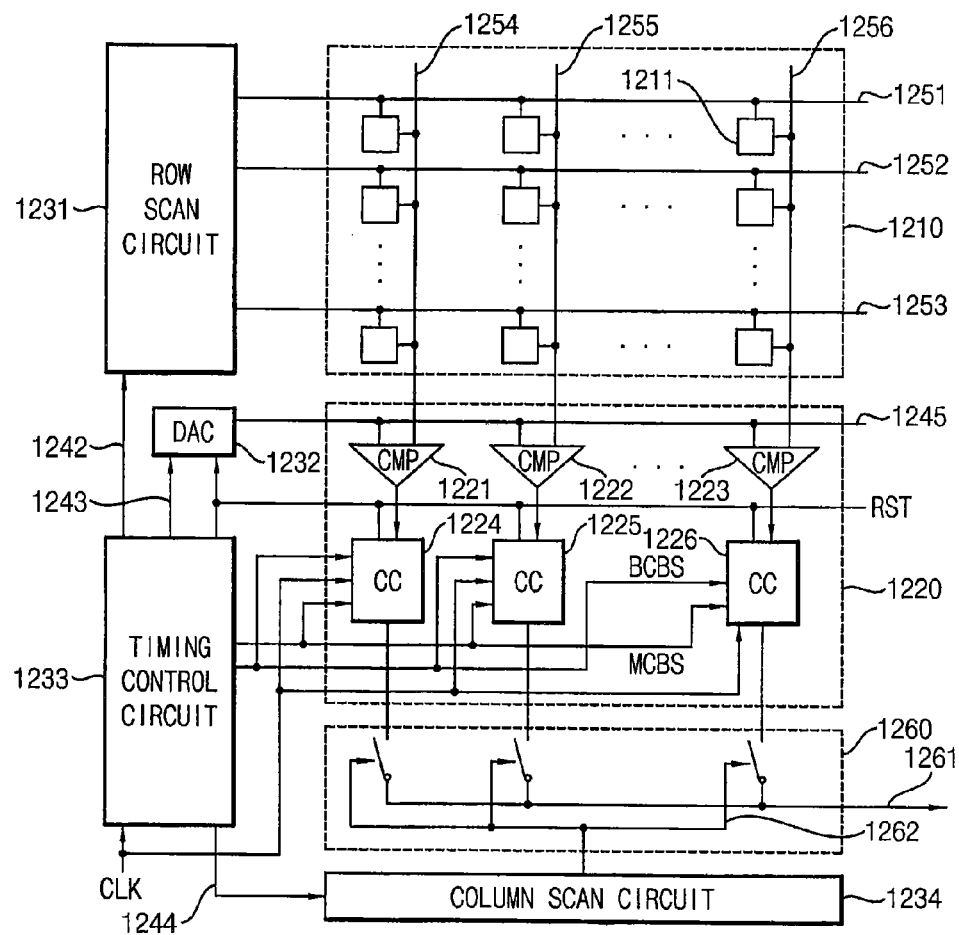
FIG. 12 is a block diagram illustrating an image sensor including the counter circuit of FIG. 1.

FIG. 12 is a block diagram illustrating an image sensor including the counter circuit of FIG. 1.

Referring to FIG. 12, an image sensor 1200 includes a pixel array 1210, an image read circuit 1220, a row scan circuit 1231, a digital/analog converter 1232, a timing control circuit 1233, a column scan circuit 1234, a switch circuit 1260, and a data output circuit 1235.

The pixel array 1210 includes a matrix comprising a pixel 1211 generating a pixel signal based on intensity of incident light. The pixel array 1210 includes a plurality of row control signal lines 1251, 1252, and 1253 and a plurality of column control signal lines 1254, 1255, 1256.

The image read circuit 1220 includes at least one comparator CMP 1221 through 1223 and at least one counter circuit CC 1224 through 1226.

The timing control circuit 1233 receives the clock signal CLK and generates a row scan circuit control signal 1242, a column scan circuit control signal 1244, a digital ramp signal RAMP 1243, a reset signal RST, a bypass control bit signal BCBS, and a memory control bit signal MCBS.

The row scan circuit 1231 enables one of the signals of a first row control signal line 1251, a second row control signal line 1252 through a (N)th row control signal line 1253 in response to the row scan circuit control signal 1242. The first row control signal line 1251, the second row control signal line 1252 through the (N)th row control signal line 1253 are included in the pixel array 1210.

The pixel array 1210 transfers the pixel signals of a row selected by enable signals of the row control signal lines 1251, 1252, and 1253 to the image read circuit 1220 through a first column signal line 1254, a second column signal line 1255 through a (M)th column signal line 1256.

The digital/analog converter 1232 converts the digital ramp signal RAMP to an analog ramp signal and transfers the analog ramp signal to a ramp signal line 1245.

A comparator 1221 outputs logical value 1 as a comparator output signal when the pixel signal is equal to or smaller than the analog ramp signal. The comparator 1221 outputs logical value 0 as the comparator output signal when the pixel signal is larger than the analog ramp signal. Operation of other comparators 1222, 1223 is same as operation of the comparator 1221.

The counter circuit 1224 may be embodied with the components with the reference to FIGS. 1 through 11. The counter circuit 1224 resets a count value as logical 0 in response to a reset signal RST. The counter circuit 1224 counts the number of edges of the clock signal CLK when the comparator output signal has logical value 1. Bit values of the count value of the bit counters included in the counter circuit 1224 are stored in bit memories included in the counter circuit 1224 when the comparator output signal has logical value 0. Operation of the counter circuits 1224, 1225, and 1226 was described with the reference to FIGS. 1 through 11.

The switch circuit 1260 selects a row in response to a switch control signal 1262 generated by the row scan circuit 1234 based on the row scan circuit control signal 1244. The switch 1260 outputs a count value of a counter circuit corresponding to the selected row through a common output line 1261 sequentially.

Figure 13:
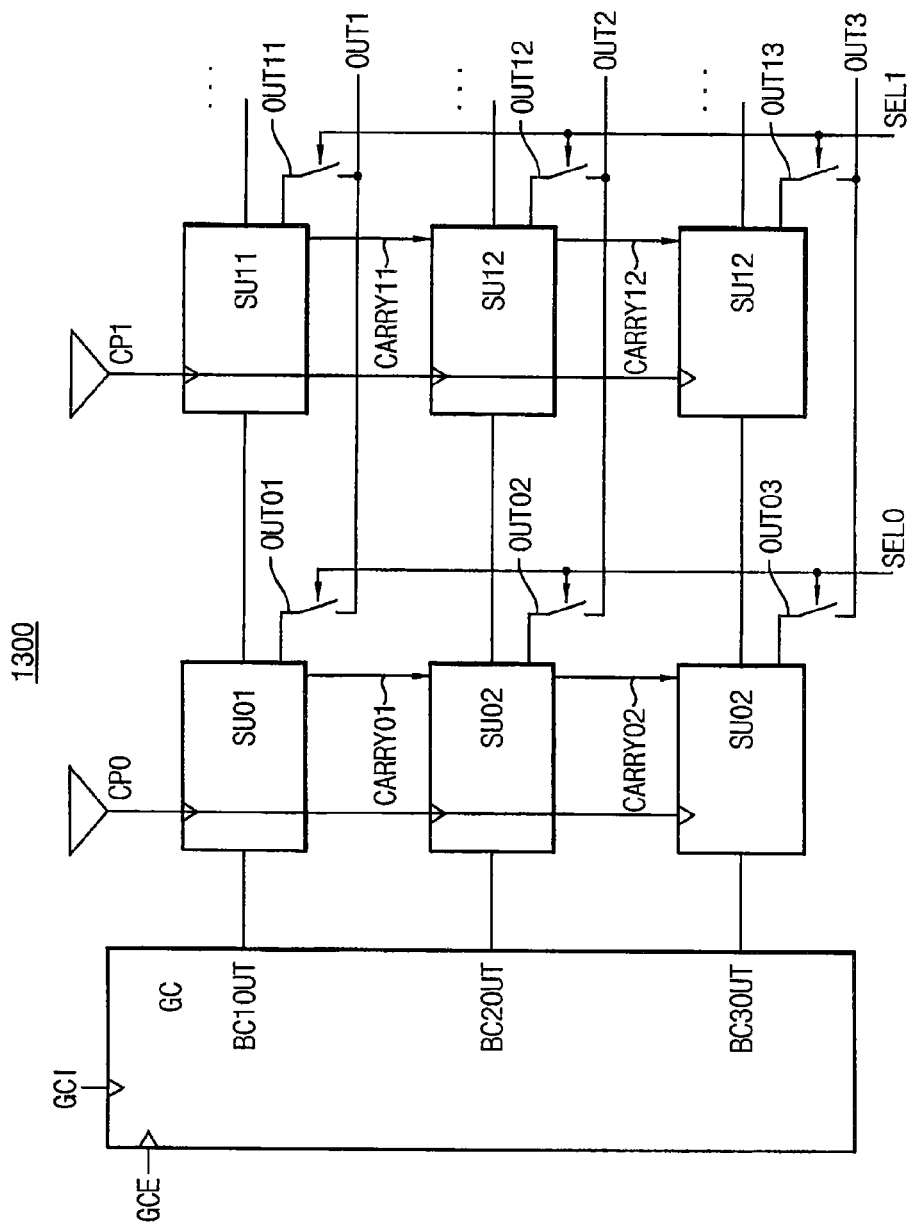
FIG. 13 is a block diagram illustrating an example of the image reading circuit included in the image sensor of FIG. 12.

FIG. 13 is a block diagram illustrating an example of the image reading circuit included in the image sensor of FIG. 12.

Referring to FIG. 13, the image sensor 1200 may include an image read circuit 1300. The image read circuit 1300 includes a global counter GC and a plurality of storing units SU01, SU02, SU03, SU11, SU12, and SU13. FIG. 13 describes the image read circuit including 3 bit analog/digital converter for example.

The global counter GC outputs bit values BC1OUT, BC2OUT, and BC3OUT of a count value of edges of a counter input signal GCI based on a global counter input signal GCI and a global counter enable signal GCE.

Each of the storing units SU01, SU02, SU03, SU11, SU12, and SU13 may includes a latch, a reset bit memory, a signal bit memory, an adder, and a result bit memory. The latch may latch each of the bit values BC1OUT, BC2OUT, and BC3OUT of the count value. The reset bit memory may store the latched value as a reset value. The signal bit memory may store the latched value as a signal value. The adder may calculate difference between the reset value and the signal value. The result bit memory may store the difference. Carries generated during calculating the difference may be transferred through carry signal lines CARRY01, CARRY02, CARRY11, and CARRY12.

Figure 14:
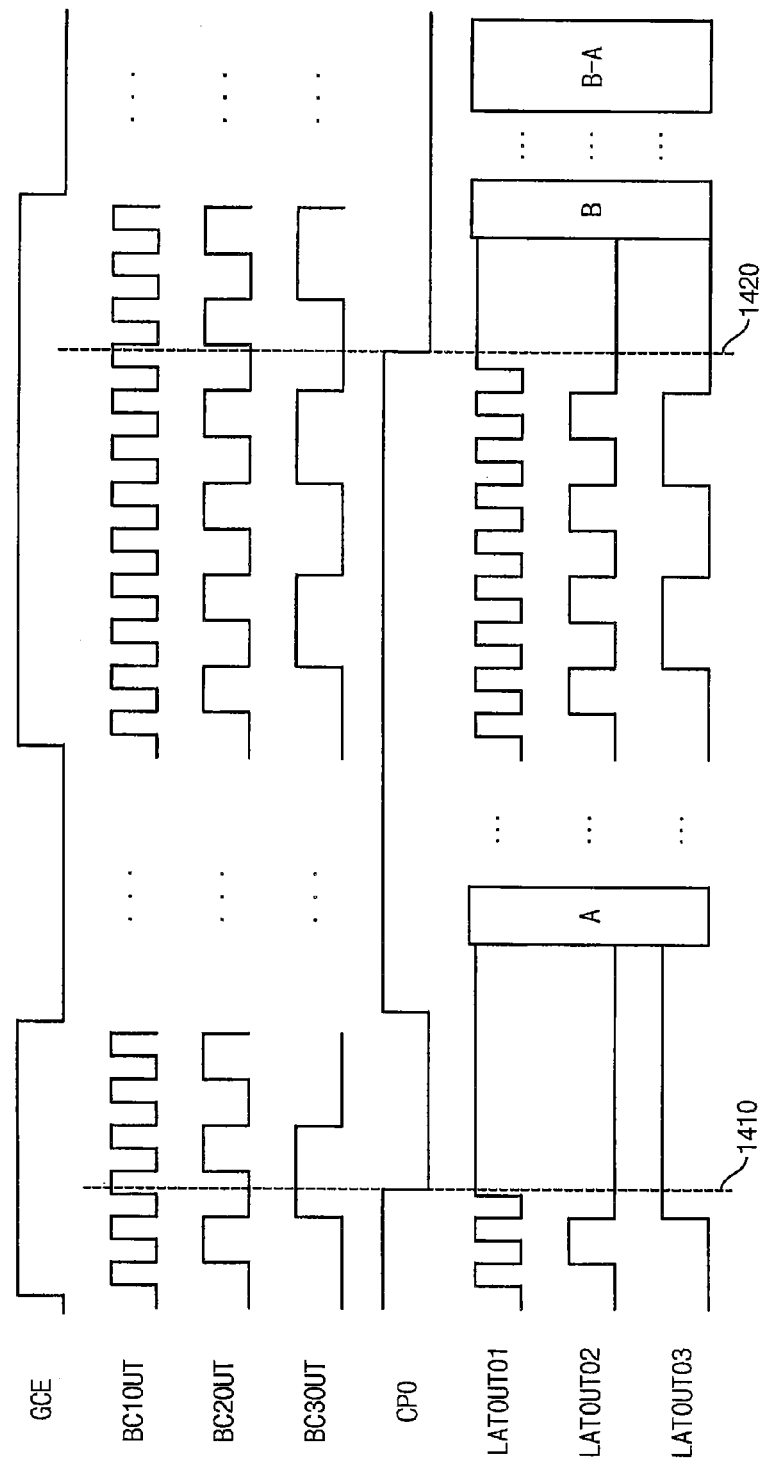
FIG. 14 is a timing diagram illustrating operation of the image reading circuit of FIG. 13.

Either an output signal OUT01 of a result bit memory included in the first storing unit/SU01 or an output signal OUT11 of a result bit memory included in the fourth storing unit SU11 may be outputted as a first output signal OUT1 based on selection signals SEL0, SEL1 Either an output signal OUT02 of a result bit memory included in the second storing unit SU02 or an output signal OUT12 of a result bit memory included in the fifth storing unit SU12 may be outputted as a second output signal OUT2 based on the selection signals SEL0, SEL1. Either an output signal OUT03 of a result bit memory included in the third storing unit SU03 or an output signal OUT13 of a result bit memory included in the sixth storing unit SU13 may be outputted as a third output signal OUT3 based on the selection signals SEL0, SELL FIG. 14 is a timing diagram illustrating operation of the image reading circuit of FIG. 13. FIG. 14 describes the global counter GC and the first storing units SU01, SU02, and SU03. Operation and structure of the second storing units SU11, SU12, and SU13 are same as the operation and structure of the first storing units SU01, SU02, and SU03.

Referring to FIG. 14, the global counter GC may count a count value of edges of the global counter input signal GCI representing a reset value of a pixel when the global counter enable signal GCE has logical value 1 and a first comparator output signal CP0 has logical value 1. A latch of the first storing unit SU01 may latch logical value 1 which is the first bit value BC1OUT of the count value at a first time point 1410 when the first comparator output signal CP0 is changed to logical value 0. A latch of the second storing unit SU02 may latch logical value 0 which is the second bit value BC2OUT of the count value at the first time point 1410. A latch of the third storing unit SU03 may latch logical value 1 which is the third bit value BC3OUT of the count value at the first time point 1410.

During a first period A, latched values of the latch of the first storing unit SU01, the latch of the second storing unit SU02, and the latch of the third storing unit SU03 at the first time point 1410 may be stored to reset bit memories included in the first storing units SU01, SU02, SU03.

The global counter GC may count a count value of edges of the global counter input signal GCI representing a signal value of a pixel when the global counter enable signal GCE has logical value 1 and a first comparator output signal CP0 has logical value 1. A latch of the first storing unit SU01 may latch logical value 1 which is the first bit value BC1OUT of the count value at a second time point 1420 when the first comparator output signal CP0 is changed to logical value 0. A latch of the second storing unit SU02 may latch logical value 0 which is the second bit value BC2OUT of the count value at the second time point 1420. A latch of the third storing unit SU03 may latch logical value 0 which is the third bit value BC3OUT of the count value at the second time point 1420.

During a second period B, latched values of the latch of the first storing unit SU01, the latch of the second storing unit SU02, and the latch of the third storing unit SU03 at the second time point 1420 may be stored to signal bit memories included in the first storing units SU01, SU02, and SU03.

During a third period B-A, difference between a stored value of the signal bit memory included in each of the first storing units SU01, SU02, and SU03 and a stored value of the reset bit memory included in each of the first storing units SU01, SU02, and SU03 may be stored to result bit memory included in each of the first storing units SU01, SU02, and SU03.

Figure 15:
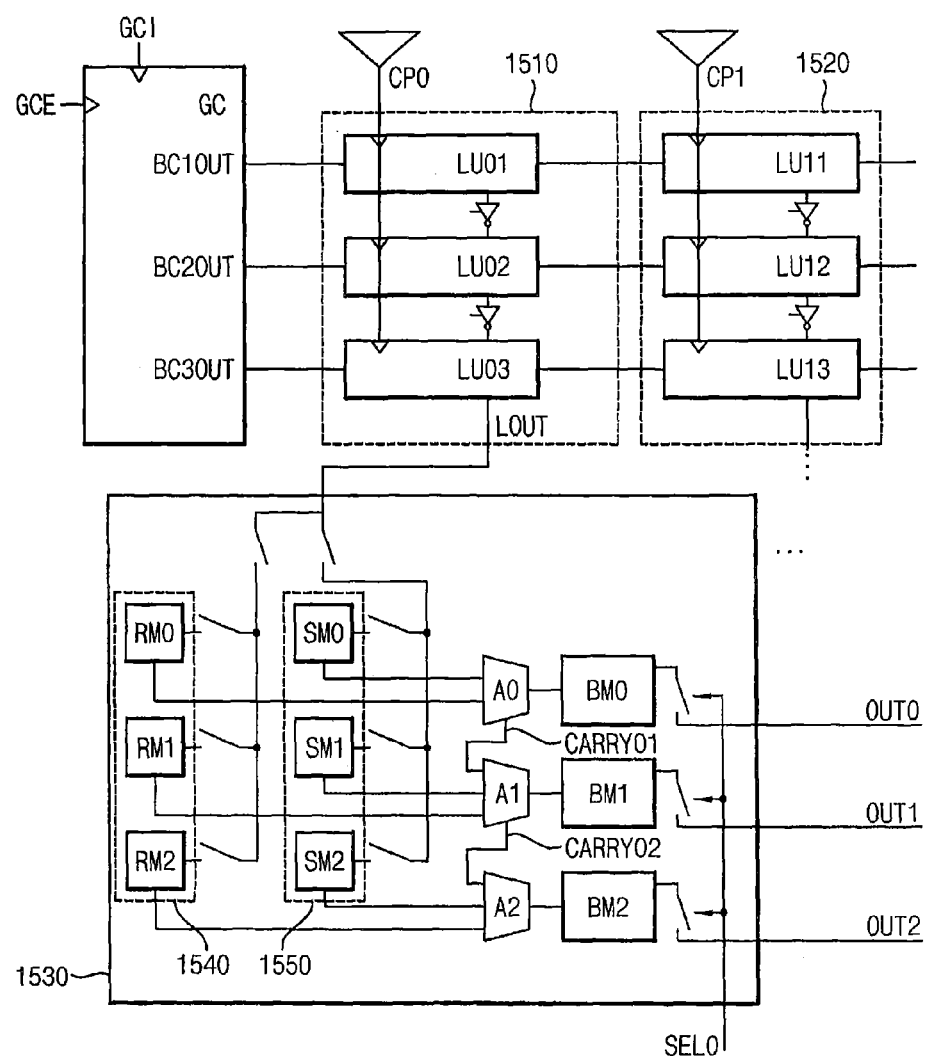
FIG. 15 is a block diagram illustrating an example of the image reading circuit included in the image sensor of FIG. 12.

FIG. 15 is a block diagram illustrating an example of the image reading circuit included in the image sensor of FIG. 12. FIG. 15 describes an image read circuit including 3 bit analog/digital converter for example.

Referring to FIG. 15, the image reading circuit 1500 includes global counter GC, a first latch block 1510, a second latch block 1520, and a first memory block 1530. The first latch block 1510 includes first latch units LU01, LU02, and LU03. The second latch block 1520 includes second latch units LU11, LU12, and LU13. The first memory block 1530 includes a reset memory block 1540, a signal memory block 1550, adders A0, A1, and A2, and resent bit memories BM0, BM1, and BM2. The reset memory block 1540 may include reset bit memories RM0, RM1, and RM2. The signal memory block 1550 may include signal bit memories SM0, SM1, and SM2. The first latch block 1510 corresponds to the first memory block 1530. The image read circuit 1500 may include a second memory block corresponding to the second latch block 1520. The second memory block is omitted in FIG. 15.

The global counter GC outputs bit values BC1OUT, BC2OUT, and BC3OUT of a count value of edges of a global counter input signal GCI based on the global counter input signal GCI and a global counter enable signal GCE.

Each of the first latch units LU01, LU02, and LU03 latches each of the bit values BC1OUT, BC2OUT, and BC3OUT of the count value when the first comparator output signal CP0 has logical value 1. The first latch block 1510 will be described because the first latch block 1510 and the second latch block 1520 have the same operation and structure. Operation and structure of the first latch block 1510 will be described with the reference to FIG. 16.

Each of the reset bit memories RM0, RM1, and RM2 of the first memory block 1530 stores each of the bit values of the count value representing the reset value of the pixel transferred through the first latch block's output signal LOUT. Each of the signal bit memories SM0, SM1, and SM2 of the first memory block 1530 stores each of the bit values of the count value representing the signal value of the pixel transferred through the first latch block's output signal LOUT. A first difference between a stored value of the first signal bit memory SM0 and a stored value of the first reset bit memory RM0 is stored in the first result bit memory BM0. A first adder A0 calculates the first difference. A first carry generated by the first adder A0 is transferred to a second adder A1 through a first carry signal line CARRY01. A second difference between a stored value of the second signal bit memory SM1 and a stored value of the second reset bit memory RM1 is stored in the second result bit memory BM1. A second adder A1 calculates the second difference based on the first carry transferred through the first carry signal line CARRY01. A second carry generated by the second adder A1 is transferred to a third adder A2 through a second carry signal line CARRY02. A third difference between a stored value of the third signal bit memory SM2 and a stored value of the third reset bit memory RM2 is stored in the third result bit memory BM2. A third adder A2 calculates the third difference based on the second carry transferred through the second carry signal line CARRY02.

The stored value of the result bit memories BM0, BM1, and BM2 included in the first memory block 1530 may be outputted as output signals OUT0, OUT1, and OUT2 when a first selection signal SEL0 has logical value 1. The stored value of the result bit memories included in the second memory block may be outputted as output signals OUT0, OUT1, and OUT2 when a second selection signal has logical value 1.

Figure 16:
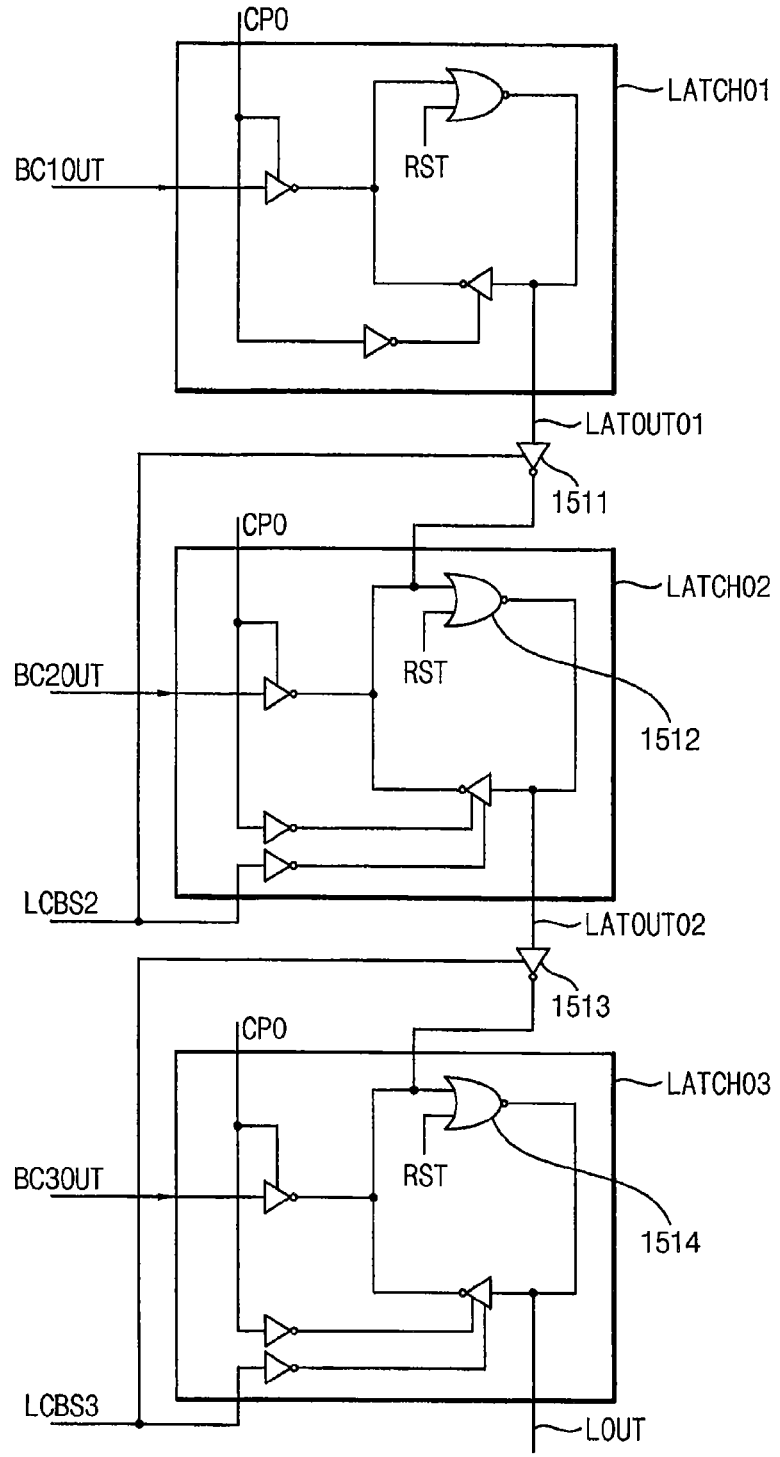
FIG. 16 is a block diagram illustrating a first latch unit included in the image reading circuit of FIG. 15.

FIG. 16 is a block diagram illustrating a first latch unit included in the image reading circuit of FIG. 15.

Referring to FIG. 16, the first latch block 1510 includes a first latch LATCH01, a second LATCH02, and a third latch LATCH03. The first latch LATCH01 resets a stored value, the first latch output signal LATOUT01, as logical value 0 based on a reset signal RST. The first latch LATCH01 latches the first bit value BC1OUT of the count value as the first latch output signal LATOUT01 when the first comparator output signal CP0 is changed from logical value 1 to logical value 0.

The second latch LATCH02 resets a stored value, the second latch output signal LATOUT02, based on the reset signal RST. The second latch LATCH02 latches the second bit value BC2OUT of the count value as the second latch output signal LATOUT2 when a second latch control bit signal LCBS2 has logical value 0 and the first comparator output signal CP0 is changed from logical value 1 to logical value 0. The first latch output signal LATOUT1 of the first latch LATCH01 is bypassed as a second latch output signal LATOUT02 of the second latch LATCH02 through a tri-state inverter 1511 and a NOR gate 1512 when the second latch control bit signal LCBS2 has logical value 1.

The third latch LATCH03 resets a stored value, the first latch block output signal LOUT, based on the reset signal RST. The third latch LATCH03 latches the third bit value BC3OUT of the count value as the first latch block output signal LOUT when a third latch control bit signal LCBS3 has logical value 0 and the first comparator output signal CP0 is changed from logical value 1 to logical value 0. The second latch output signal LATOUT2 of the second latch LATCH02 is bypassed as the first latch block output signal LOUT of the third latch LATCH03 through a tri-state inverter 1513 and a NOR gate 1514 when the third latch control bit signal LCBS3 has logical value 1.

Figure 17:
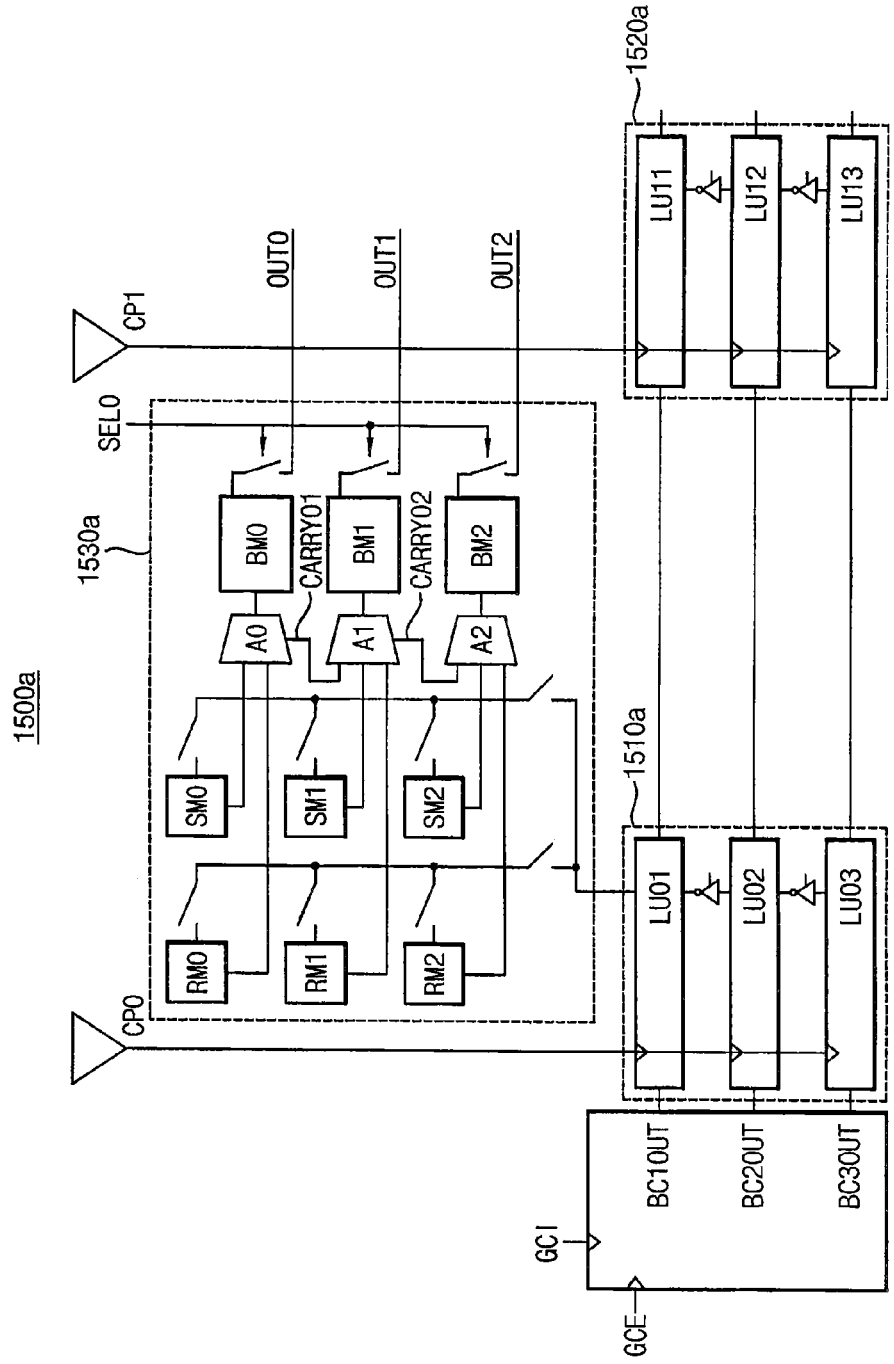
FIG. 17 is a block diagram illustrating an example of the image reading circuit included in the image sensor of FIG. 12.

FIG. 17 is a block diagram illustrating an example of the image reading circuit included in the image sensor of FIG. 12.

Referring to FIG. 17, an image read circuit 1500*a* is same as the image read circuit 1500 of FIG. 15 without a bypassing direction of a first latch block 1510*a*, a bypassing direction of a second latch block 1520*a*, and a location of a first memory block 1530*a*.

The first latch block 1510*a* may bypass a stored value from a third latch unit LU03 to a first latch unit LU01 through a second latch unit LU02. The bypassing direction of the first latch block 1510*a* is opposite to the bypassing direction of the first latch block 1510 of FIG. 16. The second latch block 1520*a* may have same or similar structure with the first latch block 1510*a*.

The first memory block 1530 may be located at lower side of the first latch block 1510 and the second latch block 1520 included in the image read circuit 1500 of FIG. 15. The first memory block 1530*a* may be located at upper side of the first latch block 1510*a* and the second latch block 1520*a* included in the image read circuit 1500*a* of FIG. 17.

Figure 18:
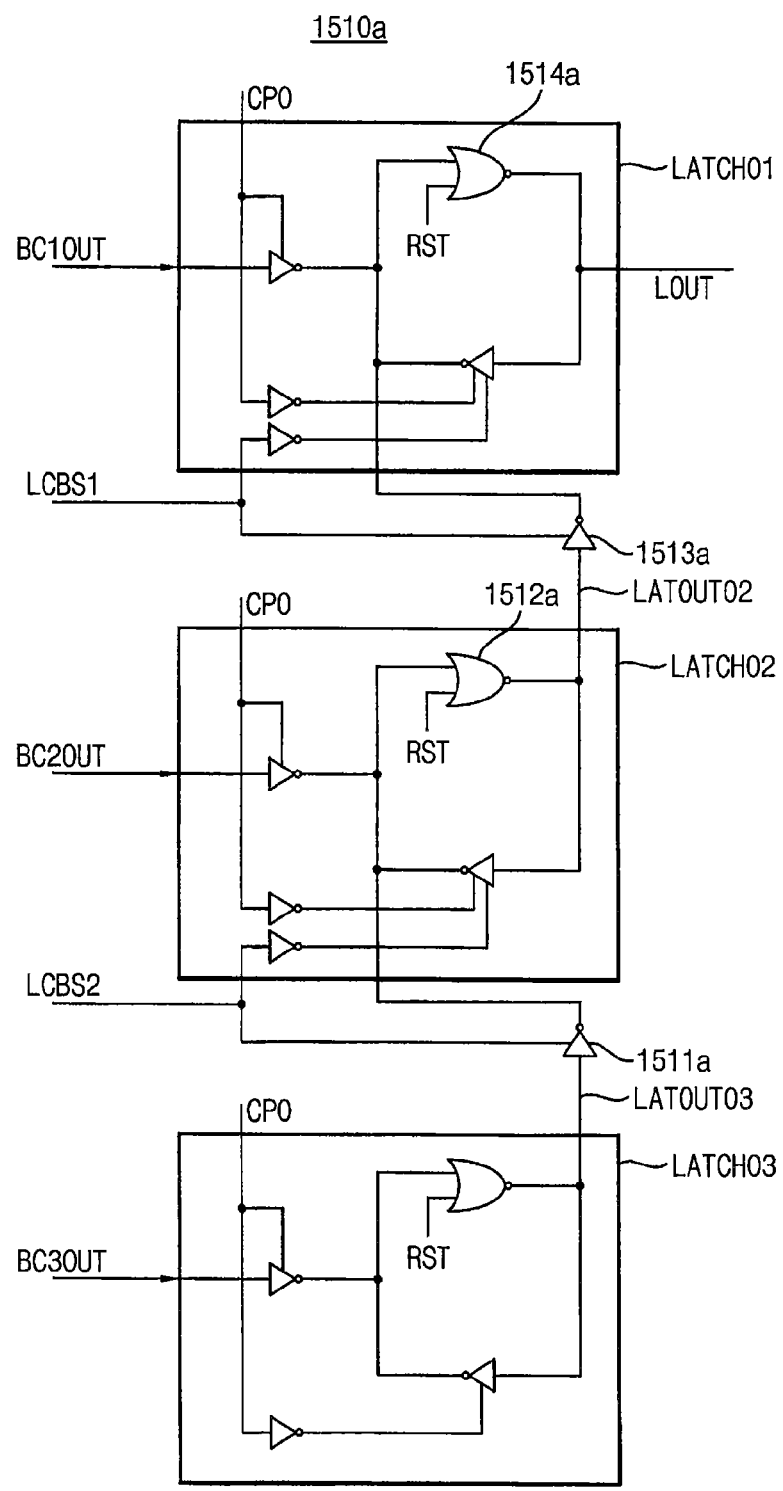
FIG. 18 is a block diagram illustrating a first latch unit included in the image reading circuit of FIG. 17.

FIG. 18 is a block diagram illustrating a first latch unit included in the image reading circuit of FIG. 17.

Referring to FIG. 18, a bypassing direction of the first latch block 1510*a* may be opposite to a bypassing direction of the first latch block 1510 of FIG. 16.

A third latch LATCH03 resets a stored value, a third latch output signal LATOUT03, as logical value 0 based on a reset signal RST. The third latch LATCH03 latches the third bit value BC3OUT of the count value as the third latch output signal LATOUT03 when the first comparator output signal CP0 is changed from logical value 1 to logical value 0.

A second latch LATCH02 resets a stored value, a second latch output signal LATOUT02, based on the reset signal RST. The second latch LATCH02 latches the second bit value BC2OUT of the count value as the second latch output signal LATOUT02 when a second latch control bit signal LCBS2 has logical value 0 and the first comparator output signal CP0 is changed from logical value 1 to logical value 0. The third latch output signal LATOUT03 of the third latch LATCH03 is bypassed as the second latch output signal LATOUT02 of the second latch LATCH02 through a tri-state inverter 1511*a* and a NOR gate 1512*a* when the second latch control bit signal LCBS2 has logical value 1.

A first latch LATCH01 resets a stored value, a first latch block output signal LOUT, based on the reset signal RST. The first latch LATCH01 latches the first bit value BC1OUT of the count value as the first latch block output signal LOUT when a first latch control bit signal LCBS1 has logical value 0 and the first comparator output signal CP0 is changed from logical value 1 to logical value 0. The second latch output signal LATOUT02 of the second latch LATCH02 is bypassed as the first latch block output signal LOUT of the first latch LATCH01 through a tri-state inverter 1513*a* and a NOR gate 1514*a* when the first latch control bit signal LCBS1 has logical value 1.

Figure 19:
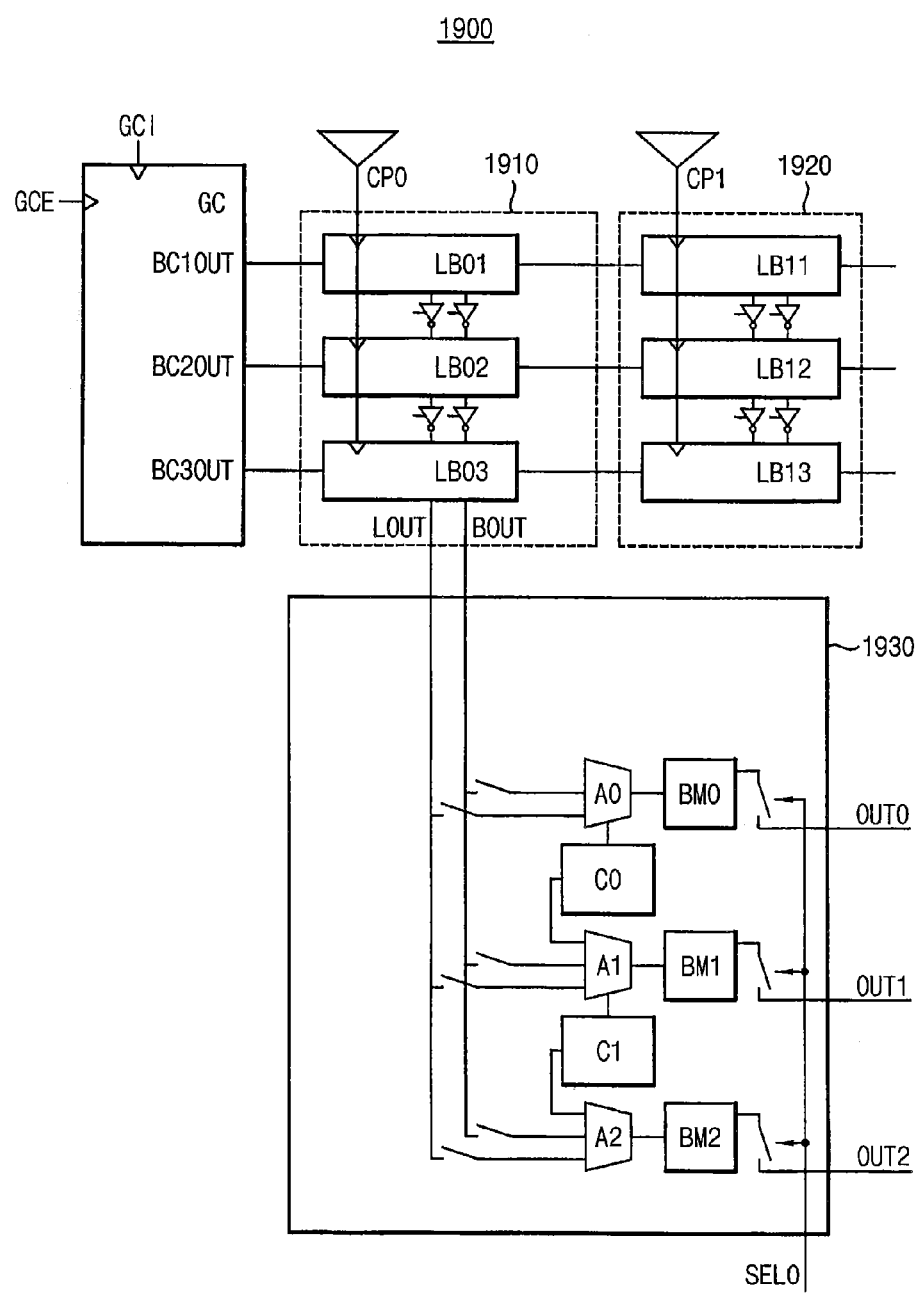
FIG. 19 is a block diagram illustrating an example of the image reading circuit included in the image sensor of FIG. 12.

FIG. 19 is a block diagram illustrating an example of the image reading circuit included in the image sensor of FIG. 12.

Referring to FIG. 19, an image read circuit 1900 includes a global counter GC, a first storing block 1910, a second storing block 1920, and a first memory block 1930. The first storing block 1910 includes the first storing units LB01, LB02, and LB03. The second storing block 1920 includes the second storing units LB11, LB12, and LB13. The first memory block 1930 includes adders A0, A1, and A2 and result bit memories BM0, BM1, and BM2. The first storing block 1910 corresponds to the first memory block 1930. The image read circuit 1900 may include a second memory block corresponding to the second storing block 1920. The second memory block is omitted in FIG. 19.

The first storing block 1910 outputs a reset value of a pixel as a first storing block latch output signal LOUT sequentially. The first storing block 1910 outputs a signal value of the pixel as the first storing block bit memory output signal BOUT sequentially. Operation and structure of the first storing block 1910 will be described with the reference to FIG. 20. The second storing block 1920 is same as the first storing block 1910.

A first difference between the first storing block latch output signal LOUT and the first storing block bit memory output signal BOUT may be stored in the first result bit memory BM0. A first adder A0 calculates the first difference. A first carry generated by the first adder A0 is transferred to a second adder A1 through a first carry memory C0. A second difference between the first storing block latch output signal LOUT and the first storing block bit memory output signal BOUT may be stored in the second result bit memory BM1. A second adder A1 calculates the second difference based on the first carry. A second carry generated by the second adder A1 is transferred to a third adder A2 through a second carry memory C1. A third difference between the first storing block latch output signal LOUT and the first storing block bit memory output signal BOUT may be stored in the third result bit memory BM2. A third adder A2 calculates the third difference based on the second carry.

The stored value of the result bit memories BM0, BM1, and BM2 included in the first memory block 1930 may be outputted as output signals OUT0, OUT1, and OUT2 when a first selection signal SEL0 has logical value 1. The stored value of the result bit memories included in the second memory block may be outputted as output signals OUT0, OUT1, and OUT2 when a second selection signal has logical value 1.

Figure 20:
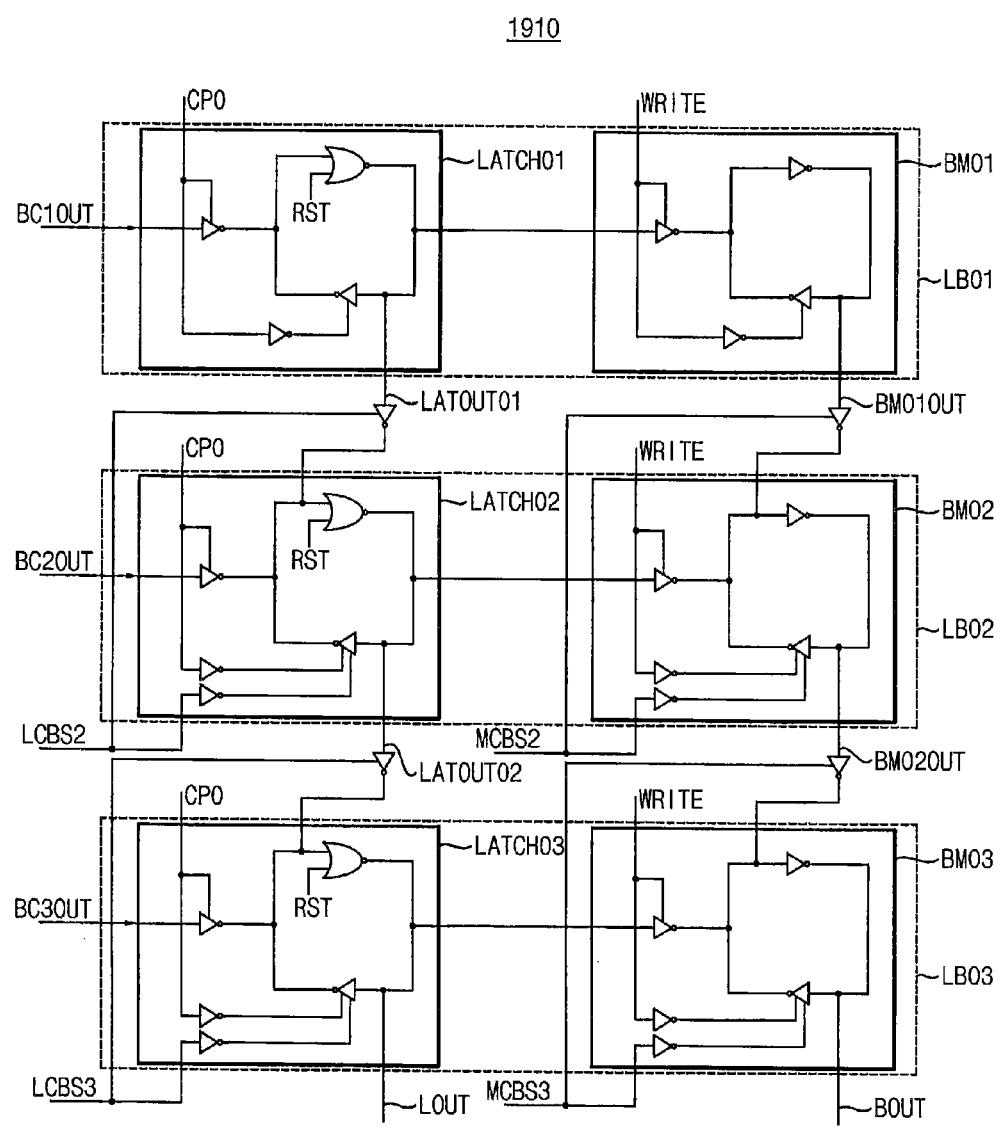
FIG. 20 is a block diagram illustrating the first storage unit included in the image reading circuit of FIG. 19.

FIG. 20 is a block diagram illustrating the first storage unit included in the image reading circuit of FIG. 19.

Referring to FIG. 20, the first storing block 1910 includes a first storing unit LB01, a second storing unit LB02, and a third storing unit LB03. The first storing unit LB01 includes a first latch LATCH01 and a first bit memory BM01. The second storing unit LB02 includes a second latch LATCH02 and a second bit memory BM02. The third storing unit LB 03 includes a third latch LATCH03 and a third bit memory BM03.

The first bit memory BM01 receives a first latch output signal LATOUT01. The second bit memory BM02 receives a second latch output signal LATCH02. The third bit memory BM03 receives a third latch output signal LATCH03.

Latches LATCH01, LATCH02, and LATCH03 include in the first storing unit 1910 of FIG. 20 may be understood with the reference to FIG. 16.

Each of latches LATCH01, LATCH02, and LATCH03 and each of bit memories BM01, BM02, BM03 may bypass a stored value in a downward direction like FIG. 20. Each of latches LATCH01, LATCH02, and LATCH03 and each of bit memories BM01, BM02, and BM03 may bypass the stored value in an upward direction like FIG. 18.

Figure 21:
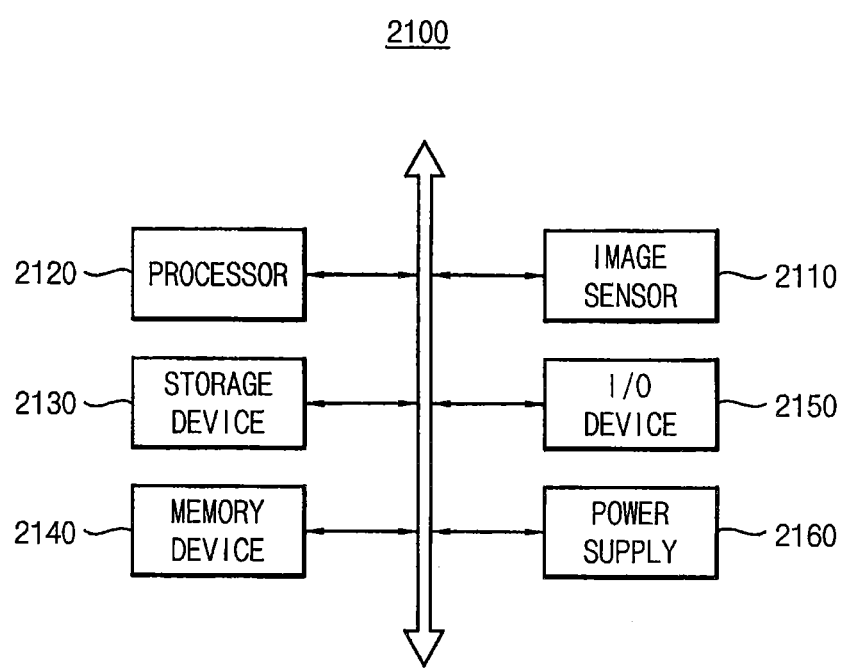
FIG. 21 is a block diagram illustrating a computing system according to example embodiments.

FIG. 21 is a block diagram illustrating a computing system according to example embodiments.

Referring to FIG. 21, a computing system 2100 may include an image sensor 2110, a processor 2120 and a storage device 2130.

The image sensor 2110 may generate a digital signal corresponding to an incident light. The storage device 2130 may store the digital signal. The processor 2120 may control operations of the image sensor 2110 and the storage device 2130.

The computing system 2100 may further include a memory device 2140, an input/output device 2150 and a power supply 2160. Although it is not illustrated in FIG. 21, the computing system 2100 may further include ports that communicate with a video card, a sound card, a memory card, a universal serial bus (USB) device, or other electronic devices.

The processor 2120 may perform various calculations or tasks. According to some embodiments, the processor 2120 may be a microprocessor or a CPU. The processor 2120 may communicate with the storage device 2130, the memory device 2140 and the input/output device 2150 via an address bus, a control bus, and/or a data bus. In some example embodiments, the processor 2120 may be coupled to an extended bus, such as a peripheral component interconnection (PCI) bus.

The storage device 2130 may include a non-volatile memory device such as a flash memory device, a solid state drive (SSD), a hard disk drive (HDD), a compact disk read-only memory (CD-ROM) drive, etc.

The memory device 2140 may store data required for an operation of the electronic device 2100. The memory device 2140 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 2150 may include a keyboard, a mouse, a printer, a display device, etc. The power supply 2160 may supply operational power.

The image sensor 2110 may be connected to the processor 2120 through one or more of the above buses or other communication links to communicate with the processor 2120. The image sensor 2110 may include a pixel array that detects incident light to generate an analog signal, and an analog-digital conversion unit that performs a sigma-delta analog-digital conversion and a cyclic analog-digital conversion with respect to the analog signal to generate a digital signal in a first operation mode and performs a single-slope analog-digital conversion with respect to the analog signal to generate the digital signal in a second operation mode.

The image sensor 2110 may include a counter circuit 100 or an image read circuit 1500 or an image read circuit 1500*a*. The image sensor 2110 may be embodied with the image sensor 1200. The image sensor 2110 may be understood based on the references to FIGS. 1 through 12, FIGS. 15 through 18, and FIGS. 19 and 20.

The image sensor 2110 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to example embodiments, the image sensor 2110 may be integrated with the processor 2120 in one chip, or the image sensor 2110 and the processor 2120 may be implemented as separate chips.

The computing system 2100 may be any computing system using an image sensor. For example, the computing system 2100 may include a digital camera, a mobile phone, a smart phone, a portable multimedia player (PMP), a personal digital assistant (PDA), etc.

FIG. 22 is a block diagram illustrating an example of an interface used in the computing system of FIG. 21.

Referring to FIG. 22, a computing system 2100 may be implemented by a data processing device (e.g., a cellular phone, a personal digital assistant, a portable multimedia player, a smart phone, etc.) that uses or supports a mobile industry processor interface (MIPI) interface. The computing system 2100 may include an application processor 2210, an image sensor 2240, a display device 2250, etc.

A CSI host 2212 of the application processor 2210 may perform a serial communication with a CSI device 2241 of the image sensor 2240 via a camera serial interface (CSI). In some embodiments, the CSI host 2212 may include a deserializer (DES), and the CSI device 2241 may include a serializer (SER). A DSI host 2211 of the application processor 2210 may perform a serial communication with a DSI device 2251 of the display device 2250 via a display serial interface (DSI). In some example embodiments, the DSI host 2211 may include a serializer (SER), and the DSI device 2251 may include a deserializer (DES).

The computing system 2100 may further include a radio frequency (RF) chip 2260 performing a communication with the application processor 2210. A physical layer (PHY) 2213 of the computing system 2100 and a physical layer (PHY) 2261 of the RF chip 2260 may perform data communications based on a MIPI DigRF. The application processor 2210 may further include a DigRF MASTER 2214 that controls the data communications according to the MIPI DigRF of the PHY 2261, and the RF chip 2260 may further include a DigRF SLAVE 2262 controlled by the DigRF MASTER 2214.

The computing system 2100 may further include a global positioning system (GPS) 2220, a storage 2270, a MIC 2280, a DRAM device 2285, and a speaker 2290. In addition, the computing system 2100 may perform communications using an ultra wideband (UWB) 2310, a wireless local area network (WLAN) 2320, a worldwide interoperability for microwave access (WIMAX) 2330, etc. However, the structure and the interface of the computing system 2100 are not limited thereto.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A counter circuit comprising:
    a plurality of cascade-connected bit counters configured to output a count value of edges of a counter input signal as a counter output signal, each of the bit counters operating selectively in a counter mode or a buffer mode in response to each of bypass control bit signals, each of the bit counters performing a counting operation in response to a received signal in the counter mode, each of the bit counters bypassing the received signal as an output signal in the buffer mode after finishing the counter mode.

2. The counter circuit of claim 1, wherein the bypass control bit signals are enabled sequentially from a last bypass control bit signal corresponding to a most significant bit (MSB) of the bypass control bit signals to a first bypass control bit signal corresponding to a least significant bit (LSB) of the bypass control bit signals.

3. The counter circuit of claim 2, wherein the bit counters enter the buffer mode sequentially from a most significant bit counter included in the bit counters to a least significant bit counter included in the bit counters in response to the bypass control bit signals.

4. The counter circuit of claim 3, wherein the counter output signal includes the bit values of the count value, the bit values being outputted sequentially as the output signal of the most significant bit counter.

5. The counter circuit of claim 2, wherein the bit counters include one or more counter mode bit counters operating in the counter mode and one or more buffer mode bit counters operating in the buffer mode, and the output signal of a most significant bit counter included in the one or more counter mode bit counters is outputted as the counter output signal by bypassing the one or more buffer mode bit counters.

6. The counter circuit of claim 5, further comprising:
    bit memories configured to, in response to memory control bit signals, sequentially receive and store the bit values of the count value included in the counter output signal.

7. The counter circuit of claim 6, wherein only the memory control bit signal corresponding to a most significant bit counter included in the one or more counter mode bit counters is enabled when the output signal of the most significant bit counter included in the one or more counter mode bit counters is outputted as the counter output signal.

8. The counter circuit of claim 1, wherein each of the bit counters includes a flip-flop and a feedback signal line configured to connect one of input ports of the flip-flop and one of output ports of the flip-flop for a toggling operation, and each of the bit counters bypasses the received signal as the output signal through the feedback signal line.

9. The counter circuit of claim 1, wherein each of the bit counters includes:
    an enable controller configured to generate an inverted enable signal by performing a logical OR operation on a reset signal and a bypass control bit signal corresponding to each of the bit counters;
    a first inverting unit configured to generate an inverted signal of the received signal selectively based on the bypass control bit signal;
    a data flip-flop including a clock signal port receiving the received signal, an inverted enable signal port receiving the inverted enable signal, a data signal port electrically connected to an output port of the first inverting unit, and an output signal port outputting a stored value in the data flip-flop; and
    a feedback signal line configured to electrically connect an inverted output signal port of the data flip-flop and the data signal port.

10. The counter circuit of claim 9, wherein the data flip-flop includes a second inverting unit configured to invert a signal transferred through the feedback signal line and output the inverted signal through the output signal port in the buffer mode.

11. The counter circuit of claim 10, wherein in the counter mode, the data flip-flop receives an inverted signal of the stored value through the data signal port and toggles the stored value.

12. The counter circuit of claim 10, wherein in the buffer mode, each of the bit counters bypasses the received signal as the output signal through the first inverting unit, the feedback signal line and the second inverting unit.

13. The counter circuit of claim 1, wherein each of the bit counters includes:
    an enable controller configured to generate an inverted enable signal by performing a logical OR operation on a reset signal and a bypass control bit signal corresponding to each of the bit counters;
    a toggle unit configured to invert a stored value at an edge of the received signal when the inverted enable signal has logic value 0, and output the inverted stored value as a toggle output signal;
    a bypass signal line configured to transfer the received signal by bypassing the toggle unit; and a multiplexer configured to output either the toggle output signal or the received signal transferred through the bypass signal line in response to the bypass control bit signal.

14. The counter circuit of claim 13, wherein the toggle unit includes a data flip-flop that includes a data signal port electrically connected to an inverted output signal port, a clock signal port receiving the received signal, an inverted enable signal port receiving the inverted enable signal, and an output signal port outputting the toggle output signal.

15. The counter circuit of claim 13, wherein the toggle unit includes a T flip-flop that includes a toggle port electrically connected to driving voltage (VDD), a clock signal port receiving the received signal, an inverted enable signal port receiving the inverted enable signal, and an output signal port outputting the toggle output signal.

16. The counter circuit of claim 13, wherein the toggle unit includes a JK flip-flop that includes a J port electrically connected to VDD and a K port electrically connected to VDD, a clock signal port receiving the received signal, an inverted enable signal port receiving the inverted enable signal, and an output signal port outputting the toggle output signal.

17. An image sensor comprising:
a pixel array including one or more pixels configured to generate pixel signals corresponding to intensity of incident light;
one or more comparators configured to generate compared result signals by comparing the pixel signals and a ramp signal;
one or more counter circuits, each of the one or more counter circuits including a plurality of cascade-connected bit counters to output a count value of edges of a clock signal as a counter output signal based on each of the compared result signals; and
a switch circuit configured to output one of the counter output signals of the one or more counter circuits as a final result signal through a common output line based on a column selection signal,
each of the bit counters operating selectively in a counter mode or a buffer mode in response to each of bypass control bit signals, each of the bit counters performing a counting operation in response to a received signal in the counter mode, each of the bit counters bypassing the received signal as an output signal in the buffer mode after finishing the counter mode.

18. A counter circuit comprising:
a global counter unit configured to output bit values of a count value of edges of a global counter input signal; and
at least one latch unit that includes the plurality of latch units and outputs latched bit values of the count values as a latch output signal sequentially, each of the at least one latch unit operating in either a latch mode or a buffer mode, the each of the at least one latch unit latching each of bit values of the count value respectively in response to each of latch control bit signals in the latch mode, the each of the bit counters bypassing a received signal as an output signal respectively in response to the each of the latch control bit signals after finishing the latch mode.

* * * * *